US012211847B2

(12) United States Patent
Shin et al.

(10) Patent No.: US 12,211,847 B2
(45) Date of Patent: Jan. 28, 2025

(54) INTEGRATED CIRCUIT DEVICES HAVING HIGHLY INTEGRATED NMOS AND PMOS TRANSISTORS THEREIN AND METHODS OF FABRICATING THE SAME

(71) Applicant: Samsung Electronics Co., Ltd., Suwon-si (KR)

(72) Inventors: Jaehoon Shin, Suwon-si (KR); Bongseok Suh, Seoul (KR); Daewon Kim, Hwaseong-si (KR); Sukhyung Park, Seoul (KR); Junggun You, Ansan-si (KR); Jaeyun Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 827 days.

(21) Appl. No.: 17/382,956

(22) Filed: Jul. 22, 2021

(65) Prior Publication Data

US 2022/0165729 A1    May 26, 2022

(30) Foreign Application Priority Data

Nov. 24, 2020    (KR) .................. 10-2020-0159293

(51) Int. Cl.
    *H01L 27/092*    (2006.01)
    *H01L 21/02*    (2006.01)
    (Continued)

(52) U.S. Cl.
    CPC ........ *H01L 27/092* (2013.01); *H01L 21/0259* (2013.01); *H01L 21/28123* (2013.01);
    (Continued)

(58) Field of Classification Search
    CPC ..... H01L 21/823864; H01L 21/823468; H01L 29/42376; H01L 21/823437; H01L 29/1033; H01L 21/823456
    See application file for complete search history.

(56) References Cited

U.S. PATENT DOCUMENTS 8,264,048 B2   9/2012   Rachmady et al.
8,969,916 B2   3/2015   Kronholz et al.
(Continued)

FOREIGN PATENT DOCUMENTS

CN    109585559 A    4/2019
KR    20100029666 A    3/2010
(Continued)

*Primary Examiner* — Alia Sabur
(74) *Attorney, Agent, or Firm* — Myers Bigel, P.A.

(57) ABSTRACT

A semiconductor device may include a substrate including first and second active regions and a field region therebetween, first and second active patterns respectively provided on the first and second active regions, first and second source/drain patterns respectively provided on the first and second active patterns, a first channel pattern between the first source/drain patterns and a second channel pattern between the second source/drain patterns, and a gate electrode extended from the first channel pattern to the second channel pattern to cross the field region. Each of the first and second channel patterns may include semiconductor patterns, which are stacked to be spaced apart from each other. A width of a lower portion of the gate electrode on the field region may decrease with decreasing distance from a top surface of the substrate.

17 Claims, 44 Drawing Sheets

(51) Int. Cl.
    *H01L 21/28*     (2006.01)
    *H01L 21/8234*     (2006.01)
    *H01L 21/8238*     (2006.01)
    *H01L 29/06*     (2006.01)
    *H01L 29/417*     (2006.01)
    *H01L 29/423*     (2006.01)
    *H01L 29/49*     (2006.01)
    *H01L 29/66*     (2006.01)
    *H01L 29/786*     (2006.01)

(52) U.S. Cl.
    CPC ........ *H01L 21/823462* (2013.01); *H01L 21/823468* (2013.01); *H01L 21/823481* (2013.01); *H01L 21/823807* (2013.01); *H01L 21/823814* (2013.01); *H01L 21/823864* (2013.01); *H01L 29/0665* (2013.01); *H01L 29/41775* (2013.01); *H01L 29/42376* (2013.01); *H01L 29/42392* (2013.01); *H01L 29/4983* (2013.01); *H01L 29/66545* (2013.01); *H01L 29/66553* (2013.01); *H01L 29/66742* (2013.01); *H01L 29/78618* (2013.01); *H01L 29/78696* (2013.01)

(56) References Cited

U.S. PATENT DOCUMENTS

| | | | |
|---|---|---|---|
| 9,991,285 | B2 | 6/2018 | Chang et al. |
| 10,262,870 | B2 | 4/2019 | Chen et al. |
| 10,269,651 | B2 | 4/2019 | Chen et al. |
| 10,784,344 | B2 | 9/2020 | Song et al. |
| 11,374,108 | B2 * | 6/2022 | Chen ............... H01L 29/66795 |
| 2016/0190271 | A1 | 6/2016 | You et al. |
| 2017/0005005 | A1 * | 1/2017 | Chen ............... H01L 21/823431 |
| 2018/0358450 | A1 | 12/2018 | Kim |
| 2020/0044087 | A1 * | 2/2020 | Guha ............... H01L 29/66439 |
| 2020/0105875 | A1 * | 4/2020 | Li ............... H01L 21/3083 |
| 2020/0176332 | A1 | 6/2020 | Song et al. |
| 2021/0082914 | A1 * | 3/2021 | Lee ............... H01L 21/823468 |
| 2021/0217860 | A1 * | 7/2021 | Ha ............... H01L 29/42356 |
| 2021/0249271 | A1 * | 8/2021 | Peng ............... H01L 29/785 |

FOREIGN PATENT DOCUMENTS

| | | |
|---|---|---|
| KR | 20160077989 A | 7/2016 |
| KR | 20180134542 A | 12/2018 |
| TW | 201916361 A | 4/2019 |

* cited by examiner

INTEGRATED CIRCUIT DEVICES HAVING HIGHLY INTEGRATED NMOS AND PMOS TRANSISTORS THEREIN AND METHODS OF FABRICATING THE SAME

REFERENCE TO PRIORITY APPLICATION

This application claims priority under 35 U.S.C. § 119 to Korean Patent Application No. 10-2020-0159293, filed Nov. 24, 2020, the disclosure of which is hereby incorporated herein by reference.

BACKGROUND

The present disclosure relates to integrated circuit devices and, in particular, to highly integrated field effect transistors (e.g., PMOS, NMOS) and methods of fabricating the same.

One example of a semiconductor device within an integrated circuit includes a metal-oxide-semiconductor field-effect transistors (MOSFETs). To meet an increasing demand for semiconductor devices with a small pattern size (e.g., small layout footprint) and reduced design rules, MOSFETs are being aggressively scaled down. Unfortunately, the scale-down of MOSFETs may lead to a deterioration in the operational properties of these semiconductor devices. A variety of studies are being conducted to overcome the technical limitations associated with the scale-down of the semiconductor devices and to realize higher performance semiconductor devices with high yield and reliability.

SUMMARY

Embodiments of the inventive concept provide semiconductor devices with improved electric characteristics and higher reliability, and methods of fabricating the same.

According to an embodiment of the inventive concept, a semiconductor device may include a substrate including a first active region, a second active region, and a field region extending between the first and second active regions. A first active pattern is provided on the first active region, and a second active pattern is provided on the second active region. First source/drain patterns are provided on the first active pattern, and second source/drain patterns are provided on the second active pattern. A first channel pattern is provided between the first source/drain patterns, and a second channel pattern is provided between the second source/drain patterns. Each of the first and second channel patterns include semiconductor patterns, which are stacked to be spaced apart from each other. A gate electrode is provided, which extends from the first channel pattern to the second channel pattern to cross the field region. Advantageously, a width of a lower portion of the gate electrode, which extends on and crosses the field region, is configured to decrease with decreasing distance from a top surface of the underlying substrate.

According to another embodiment of the inventive concept, a semiconductor device may include an active pattern on a substrate, and first and second channel patterns on the active pattern. Each of the first and second channel patterns includes first to third semiconductor patterns, which are vertically stacked to be spaced apart from each other. A source/drain pattern is provided, which is interposed between the first and second channel patterns. First and second gate electrodes are provided, which cross the first and second channel patterns, respectively. First and second gate spacers are respectively provided on opposite side surfaces of the first and second gate electrodes. In a plan view taken at a level of the first semiconductor pattern, the source/drain pattern may be extended from the first semiconductor pattern to a space between the first and second gate spacers. Each of the first and second gate spacers may include a first portion provided on the side surface of the gate electrode corresponding thereto, and a second portion, which protrudes into a region between the first semiconductor pattern and the gate electrode. The second portion may be provided between the first semiconductor pattern and the gate electrode and between the source/drain pattern and the gate electrode.

According to a further embodiment of the inventive concept, a semiconductor device may include a substrate having a first active region, a second active region, and a field region therein. The field region may extend between the first and second active regions, and the first and second active regions may be adjacent to each other in a first direction. First and second active patterns are provided on the first and second active regions, respectively. A pair of first source/drain patterns are provided on the first active pattern and a pair of second source/drain patterns are provided on the second active pattern. A first channel pattern is interposed between the pair of first source/drain patterns, and a second channel pattern is interposed between the pair of second source/drain patterns. Each of the first and second channel patterns includes a first semiconductor pattern, a second semiconductor pattern, and a third semiconductor pattern, which are vertically stacked to be spaced apart from each other. A gate electrode is provided, which extends from the first channel pattern to the second channel pattern in the first direction and crosses the field region. A first gate insulating layer and a second gate insulating layer are respectively interposed between the first channel pattern and the gate electrode, and between the second channel pattern and the gate electrode. A gate spacer is provided on a side surface of the gate electrode, a gate capping pattern is provided on a top surface of the gate electrode. A first interlayer insulating layer is provided on the gate capping pattern. An active contact is provided to penetrate the first interlayer insulating layer. This active contact is electrically coupled to at least one of the first and second source/drain patterns. A gate contact is provided to penetrate the first interlayer insulating layer, and is electrically coupled to the gate electrode. A second interlayer insulating layer is provided on the first interlayer insulating layer. A first metal layer is provided in the second interlayer insulating layer. The first metal layer includes first interconnection lines, which are electrically connected to the active contact and the gate contact. A third interlayer insulating layer is provided on the second interlayer insulating layer, and a second metal layer provided in the third interlayer insulating layer. The second metal layer may include second interconnection lines, which are electrically connected to the first interconnection lines. On each of the first and second active regions, the gate electrode may include a first portion interposed between the substrate and the first semiconductor pattern, a second portion interposed between the first semiconductor pattern and the second semiconductor pattern, a third portion interposed between the second semiconductor pattern and the third semiconductor pattern, and a fourth portion on the third semiconductor pattern. On the field region, a width of a lower portion of the gate electrode may decrease with decreasing distance from a top surface of the substrate.

BRIEF DESCRIPTION OF THE DRAWINGS

FIGS. 7, 9, 12, 15, 20, 25, 30, 34, and 38 are cross-sectional views, which are taken along the line A-A' of FIG. 1 to illustrate the fabrication method according to an embodiment of the inventive concept.

FIGS. 16, 21, 26, 31, 35, and 39 are cross-sectional views, which are taken along the line B-B' of FIG. 1 to illustrate the fabrication method according to an embodiment of the inventive concept.

FIGS. 10, 13, 17, 22, 27, 32, 36, and 40 are cross-sectional views, which are taken along the line C-C' of FIG. 1 to illustrate the fabrication method according to an embodiment of the inventive concept.

FIGS. 18, 23, and 28 are cross-sectional views, which are taken along the line D-D' of FIG. 1 to illustrate the fabrication method according to an embodiment of the inventive concept.

FIGS. 8, 11, 14, 19, 24, 29, 33, 37, and 41 are cross-sectional views, which are taken along the line E-E' of FIG. 1 to illustrate the fabrication method according to an embodiment of the inventive concept.

DETAILED DESCRIPTION

Figure 1:
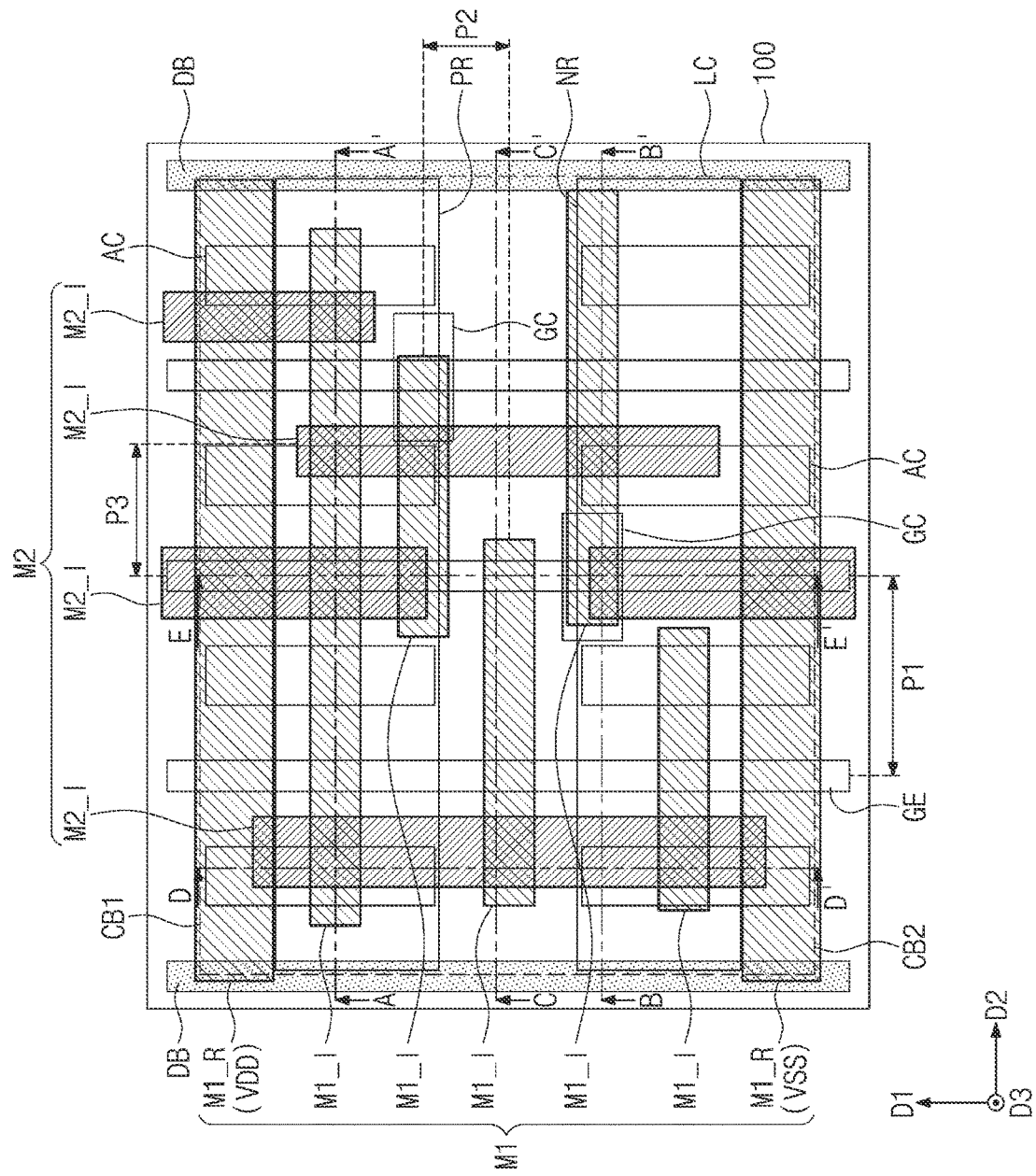
FIG. 1 is a plan view illustrating a semiconductor device according to an embodiment of the inventive concept.
Figure 4A:
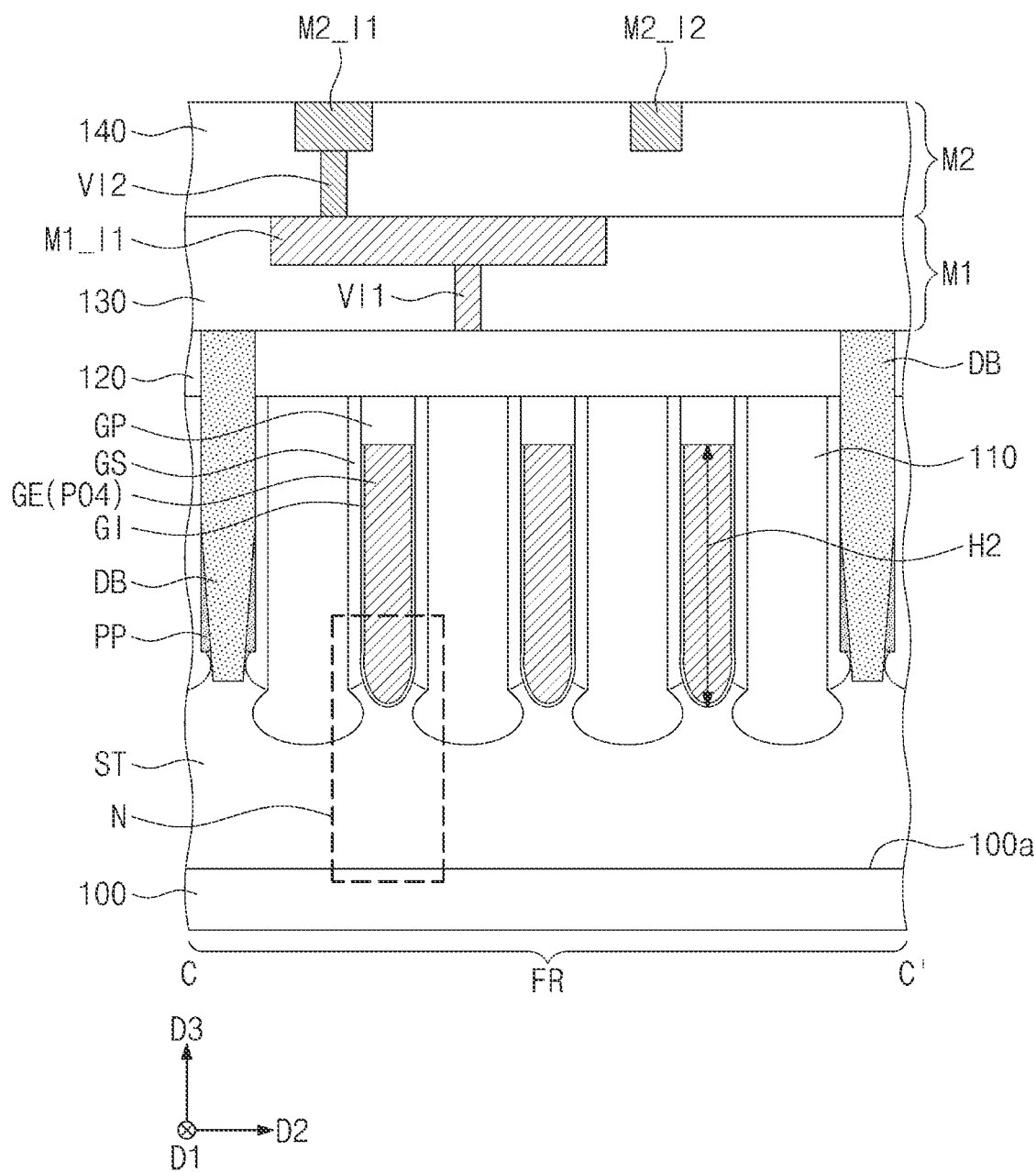
Figure 4B:
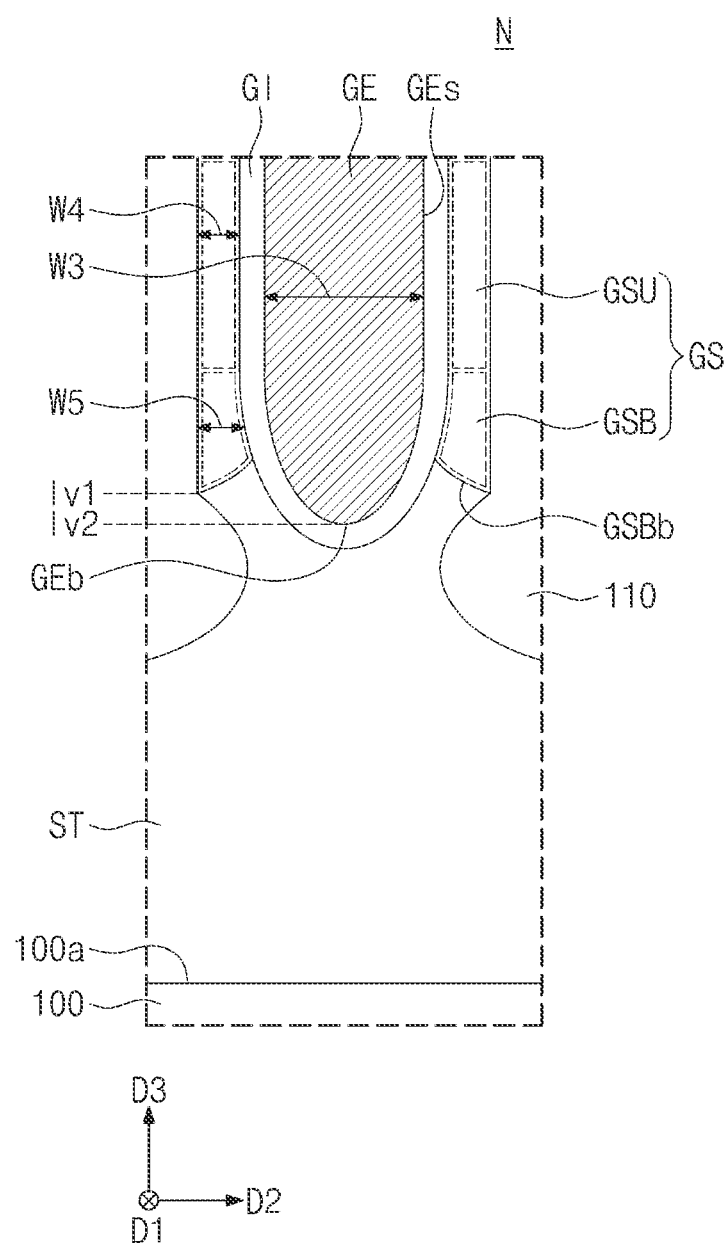
FIG. 4B is an enlarged cross-sectional view illustrating a portion N of FIG. 4A.

FIG. 1 is a plan view illustrating a semiconductor device according to an embodiment of the inventive concept. FIGS. 2A, 3, 4A, 5, and 6 are cross-sectional views respectively taken along lines A-A', B-B', C-C', D-D', and E-E' of FIG. 1. FIG. 2B is an enlarged cross-sectional view illustrating a highlighted portion M of FIG. 2A, whereas FIG. 2C is a top plan view taken along a line F-F' of FIG. 2A. FIG. 4B is an enlarged cross-sectional view illustrating a highlighted portion N of FIG. 4A.

Referring to FIGS. 1, 2A, 3, 4A, 5, and 6, a logic cell LC may be provided on a substrate 100. Logic transistors, which are components of a logic circuit, may be disposed on the logic cell LC. The substrate 100 may be a semiconductor substrate, which is formed of or includes silicon, germanium, silicon-germanium, or the like, or a compound semiconductor substrate. As an example, the substrate 100 may be a silicon wafer, silicon die, or a semiconductor-on-insulator (SOI) substrate.

The logic cell LC may include a PMOSFET region PR, an NMOSFET region NR, and a field region FR. The PMOSFET and NMOSFET regions PR and NR may be defined by a second trench TR2, which is formed in an upper portion of the substrate 100. In other words, the second trench TR2 may be placed between the PMOSFET and NMOSFET regions PR and NR. The PMOSFET and NMOSFET regions PR and NR may be spaced apart from each other, in a first direction D1, with the second trench TR2 interposed therebetween. The field region FR may be interposed between the PMOSFET region PR and the NMOSFET region NR. The field region FR may mean a region between the PMOSFET region PR and the NMOSFET region NR. In the present specification, the PMOSFET region PR may be referred to as a first active region PR, and the NMOSFET region NR may be referred to as a second active region NR.

A first active pattern AP1 and a second active pattern AP2 may be defined by a first trench TR1, which is formed in an upper portion of the substrate 100. The first and second active patterns AP1 and AP2 may be provided on each of the PMOSFET and NMOSFET regions PR and NR. The first and second active patterns AP1 and AP2 may not be provided on the field region FR. The first trench TR1 may be shallower than the second trench TR2. The first and second active patterns AP1 and AP2 may be extended in a second direction D2. The first and second active patterns AP1 and AP2 may be vertically-protruding portions of the substrate 100.

A device isolation layer ST may be provided to fill the first and second trenches TR1 and TR2. The device isolation layer ST may include a silicon oxide layer. Upper portions of the first and second active patterns AP1 and AP2 may protrude vertically above the device isolation layer ST (e.g., see FIG. 2D). The device isolation layer ST may not cover the upper portions of the first and second active patterns AP1 and AP2. The device isolation layer ST may cover lower side surfaces of the first and second active patterns AP1 and AP2.

The first active pattern AP1 may include an upper portion serving as a first channel pattern CH1. The second active pattern AP2 may include an upper portion serving as a second channel pattern CH2. Each of the first and second channel patterns CH1 and CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (i.e., a third direction D3).

Each of the first to third semiconductor patterns SP1, SP2, and SP3 may be formed of or include silicon (Si), germanium (Ge), or silicon-germanium (SiGe). In an embodiment, each of the first to third semiconductor patterns SP1, SP2, and SP3 may be formed of or include crystalline silicon.

A plurality of first recesses RS1 may be formed in the upper portion of the first active pattern AP1. First source/drain patterns SD1 may be provided in the first recesses RS1, respectively. The first source/drain patterns SD1 may be impurity regions of a first conductivity type (e.g., p-type). The first channel pattern CH1 may be interposed between each pair of the first source/drain patterns SD1. In other words, each pair of the first source/drain patterns SD1 may be connected to each other by the stacked first to third semiconductor patterns SP1, SP2, and SP3 of the first channel pattern CH1.

A plurality of second recesses RS2 may be formed in the upper portion of the second active pattern AP2. Second source/drain patterns SD2 may be provided in the second recesses RS2, respectively. The second source/drain patterns SD2 may be impurity regions of a second conductivity type (e.g., n-type). The second channel pattern CH2 may be interposed between each pair of the second source/drain patterns SD2. In other words, each pair of the second source/drain patterns SD2 may be connected to each other by the stacked first to third semiconductor patterns SP1, SP2, and SP3 of the second channel pattern CH2.

The first and second source/drain patterns SD1 and SD2 may be epitaxial patterns, which are formed by a selective epitaxial growth (SEG) process. As an example, each of the first and second source/drain patterns SD1 and SD2 may have a top surface that is located at substantially the same level as a top surface of the third semiconductor pattern SP3. However, in an embodiment, the top surface of each of the first and second source/drain patterns SD1 and SD2 may be higher than the top surface of the third semiconductor pattern SP3.

The first source/drain patterns SD1 may include a semiconductor material (e.g., SiGe) having a lattice constant greater than that of the substrate 100. In this case, the pair of the first source/drain patterns SD1 may exert a compressive stress on the first channel patterns CH1 therebetween. The second source/drain patterns SD2 may be formed of or include the same semiconductor material (e.g., Si) as the substrate 100.

Each of the first source/drain patterns SD1 may include a first semiconductor layer SEL1 and a second semiconductor layer SEL2, which are sequentially stacked. A sectional shape of the first source/drain pattern SD1 taken parallel to the second direction D2 will be described with reference to FIG. 2A.

The first semiconductor layer SEL1 may cover an inner surface of a first recess RS1. The first semiconductor layer SEL1 may have a decreasing thickness in an upward direction. For example, the thickness of the first semiconductor layer SEL1, which is measured in the third direction D3 at the bottom level of the first recess RS1, may be larger than the thickness of the first semiconductor layer SEL1, which is measured in the second direction D2 at the top level of the first recess RS1. The first semiconductor layer SEL1 may have a 'U'-shaped section, due to a sectional profile of the first recess RS1.

The second semiconductor layer SEL2 may fill a remaining space of the first recess RS1 excluding the first semiconductor layer SEL1. A volume of the second semiconductor layer SEL2 may be larger than a volume of the first semiconductor layer SEL1. In other words, a ratio of a volume of the second semiconductor layer SEL2 to a total volume of the first source/drain pattern SD1 may be greater than a ratio of a volume of the first semiconductor layer SEL1 to the total volume of the first source/drain pattern SD1.

Each of the first and second semiconductor layers SEL1 and SEL2 may be formed of or include silicon-germanium (SiGe). In detail, the first semiconductor layer SEL1 may be provided to have a relatively low germanium concentration. In another embodiment, the first semiconductor layer SEL1 may be provided to contain only silicon (Si) and not germanium (Ge). The germanium concentration of the first semiconductor layer SEL1 may range from 0 at % to 10 at %, where at % denotes atomic percent.

The second semiconductor layer SEL2 may be provided to have a relatively high germanium concentration. As an example, the germanium concentration of the second semiconductor layer SEL2 may range from 30 at % to 70 at %. The germanium concentration of the second semiconductor layer SEL2 may increase in the third direction D3. For example, the germanium concentration of the second semiconductor layer SEL2 may be about 40 at % near the first semiconductor layer SEL1 but may be about 60 at % at its top level.

The first and second semiconductor layers SEL1 and SEL2 may include impurities (e.g., boron), allowing the first source/drain pattern SD1 to have the p-type conductivity. In an embodiment, a concentration of impurities in the second semiconductor layer SEL2 (in at %) may be greater than that in the first semiconductor layer SEL1.

The first semiconductor layer SEL1 may prevent a stacking fault from occurring between the substrate 100 and the second semiconductor layer SEL2 and between the first to third semiconductor patterns SP1, SP2, and SP3 and the second semiconductor layer SEL2. The stacking fault may lead to an increase of a channel resistance. The stacking fault may easily occur on the bottom of the first recess RS1. Thus, if the first semiconductor layer SEL1 adjacent to the first recess RS1 is provided to have a relatively large thickness, the stacking fault may be prevented.

The first semiconductor layer SEL1 may protect the second semiconductor layer SEL2, in a process of replacing sacrificial layers SAL with first to third portions PO1, PO2, and PO3 of a gate electrode GE. For example, the first semiconductor layer SEL1 may prevent the second semiconductor layer SEL2 from being undesirably etched by an etching material, which is used to remove the sacrificial layers SAL.

The gate electrodes GE may be provided to cross the first and second active patterns AP1 and AP2 and to extend in the first direction D1. The gate electrodes GE may be arranged with a first pitch P1 in the second direction D2. Each of the gate electrodes GE may be overlapped with the first and second channel patterns CH1 and CH2 when viewed in a plan view.

The gate electrode GE may include a first portion PO1 interposed between the substrate 100 and the first semiconductor pattern SP1, a second portion PO2 interposed between the first semiconductor pattern SP1 and the second semiconductor pattern SP2, a third portion PO3 interposed between the second semiconductor pattern SP2 and the third semiconductor pattern SP3, and a fourth portion PO4 on the third semiconductor pattern SP3.

Referring back to FIG. 2A, the first to third portions PO1, PO2, and PO3 of the gate electrode GE on the PMOSFET region PR may have different widths from each other. For example, the largest width of the third portion PO3 in the second direction D2 may be larger than the largest width of the second portion PO2 in the second direction D2. The largest width of the first portion PO1 in the second direction D2 may be larger than the largest width of the third portion PO3 in the second direction D2.

Referring back to FIG. 6, the gate electrode GE may be provided on a top surface TS, a bottom surface BS, and opposite side surfaces SW of each of the first to third semiconductor patterns SP1, SP2, and SP3. In other words, the logic transistor according to the present embodiment may be a three-dimensional field-effect transistor (e.g., multi-bridge channel field-effect transistor (MBCFET)), in which the gate electrode GE is provided to three-dimensionally surround the channel pattern.

Referring to FIGS. 1, 2A, 3, 4A, 5, and 6, a pair of gate spacers GS may be respectively disposed on opposite side surfaces of the fourth portion PO4 of the gate electrode GE. The gate spacers GS may be extended along the gate electrode GE and in the first direction D1. Top surfaces of the gate spacers GS may be higher than a top surface of the gate electrode GE. The top surfaces of the gate spacers GS may be coplanar with a top surface of a first interlayer insulating layer 110, which will be described below. The gate spacers GS may be formed of or include at least one of SiCN, SiCON, or SiN. In an embodiment, the gate spacers GS may have a multi-layered structure including at least two layers, each of which is made of SiCN, SiCON, or SiN. The gate spacer GS will be described in more detail with reference to FIGS. 2B, 2C, and 4B.

A gate capping pattern GP may be provided on the gate electrode GE. The gate capping pattern GP may be extended along the gate electrode GE and in the first direction D1. The gate capping pattern GP may be formed of or include a material having an etch selectivity with respect to first and second interlayer insulating layers 110 and 120, which will be described below. For example, the gate capping patterns GP may be formed of or include at least one of SiON, SiCN, SiCON, or SiN.

A gate insulating layer GI may be interposed between the gate electrode GE and the first channel pattern CH1 and between the gate electrode GE and the second channel pattern CH2. The gate insulating layer GI may cover the top surface TS, the bottom surface BS, and the opposite side surfaces SW of each of the first to third semiconductor patterns SP1, SP2, and SP3. The gate insulating layer GI may cover the top surface of the device isolation layer ST below the gate electrode GE (e.g., see FIG. 6).

In an embodiment, the gate insulating layer GI may include a silicon oxide layer, a silicon oxynitride layer, and/or a high-k dielectric layer. The high-k dielectric layer may be formed of or include at least one of high-k dielectric materials whose dielectric constants are higher than that of silicon oxide. As an example, the high-k dielectric materials may be formed of or include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and/or lead zinc niobate.

In another embodiment, the semiconductor device may include a negative capacitance (NC) FET using a negative capacitor. For example, the gate insulating layer GI may include a ferroelectric layer exhibiting a ferroelectric material property and a paraelectric layer exhibiting a paraelectric material property.

The ferroelectric layer may have a negative capacitance, and the paraelectric layer may have a positive capacitance. In the case where two or more capacitors are connected in series and each capacitor has a positive capacitance, a total capacitance may be less than a capacitance of each of the capacitors. By contrast, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS) less than 60 mV/decade, at the room temperature.

The ferroelectric layer may have a ferroelectric material property. The ferroelectric layer may be formed of or include at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). Alternatively, the hafnium zirconium oxide may be a compound composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn).

The kind of the dopants in the ferroelectric layer may vary depending on a ferroelectric material included in the ferroelectric layer.

In the case where the ferroelectric layer includes hafnium oxide, the dopants in the ferroelectric layer may include at least one of, for example, gadolinium (Gd), silicon (Si), zirconium (Zr), aluminum (Al), and/or yttrium (Y).

In the case where the dopants are aluminum (Al), a content of aluminum in the ferroelectric layer may range from 3 to 8 at % (atomic percentage). Here, the content of the aluminum as the dopants may be a ratio of the number of aluminum atoms to the number of hafnium and aluminum atoms.

In the case where the dopants are silicon (Si), a content of silicon in the ferroelectric layer may range from 2 at % to 10 at %. In the case where the dopants are yttrium (Y), a content of yttrium in the ferroelectric layer may range from 2 at % to 10 at %. In the case where the dopants are gadolinium (Gd), a content of gadolinium in the ferroelectric layer may range from 1 at % to 7 at %. In the case where the dopants are zirconium (Zr), a content of zirconium in the ferroelectric layer may range from 50 at % to 80 at %.

The paraelectric layer may have a paraelectric material property. The paraelectric layer may be formed of or include at least one of, for example, silicon oxide and/or high-k metal oxides. The metal oxides, which can be used as the paraelectric layer, may include at least one of, for example, hafnium oxide, zirconium oxide, and/or aluminum oxide, but the inventive concept is not limited to these examples.

The ferroelectric layer and the paraelectric layer may be formed of or include the same material. The ferroelectric layer may have the ferroelectric material property, but the paraelectric layer may not have the ferroelectric material property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric material property, only when it is in a specific range of thickness. In an embodiment, the ferroelectric layer may have a thickness ranging from 0.5 to 10 nm, but the inventive concept is not limited to this example. Since a critical thickness associated with the occurrence of the ferroelectric property varies depending on the kind of the ferroelectric material, the thickness of the ferroelectric layer may be changed depending on the kind of the ferroelectric material.

As an example, the gate insulating layer GI may include a single ferroelectric layer. As another example, the gate insulating layer GI may include a plurality of ferroelectric layers spaced apart from each other. The gate insulating layer GI may have a multi-layered structure, in which a plurality of ferroelectric layers and a plurality of paraelectric layers are alternately stacked.

The gate electrode GE may include a first metal pattern and a second metal pattern on the first metal pattern. The first metal pattern may be provided on the gate insulating layer GI and may be adjacent to the first to third semiconductor patterns SP1, SP2, and SP3. The first metal pattern may include a work function metal, which can be used to adjust a threshold voltage of the transistor. By adjusting a thickness and composition of the first metal pattern, it may be possible to realize a transistor having a desired threshold voltage. For example, the first to third portions PO1, PO2, and PO3 of the gate electrode GE may be composed of the first metal pattern or the work function metal.

The first metal pattern may include a metal nitride layer. For example, the first metal pattern may include at least one metal, which is selected from the group consisting of titanium (Ti), tantalum (Ta), aluminum (Al), tungsten (W) and molybdenum (Mo), and nitrogen (N). In an embodiment, the first metal pattern may further include carbon (C). The first metal pattern may include a plurality of work function metal layers, which are stacked.

The second metal pattern may include a metallic material whose resistance is lower than the first metal pattern. For example, the second metal pattern may include at least one metal selected from the group consisting of tungsten (W), aluminum (Al), titanium (Ti), and tantalum (Ta). For example, the fourth portion PO4 of the gate electrode GE may include the first metal pattern and the second metal pattern on the first metal pattern.

Referring back to FIG. 3, insulating patterns IP may be provided on the NMOSFET region NR. Each of the insulating patterns IP may be interposed between the second source/drain pattern SD2 and a corresponding one of the first to third portions PO1, PO2, and PO3 of the gate electrode GE. The insulating patterns IP may be in direct contact with the second source/drain pattern SD2. Each of the first to third portions PO1, PO2, and PO3 of the gate electrode GE may be spaced apart from the second source/drain pattern SD2 by the insulating pattern IP.

A first interlayer insulating layer 110 may be provided on the substrate 100. The first interlayer insulating layer 110 may cover the gate spacers GS and the first and second source/drain patterns SD1 and SD2. The first interlayer insulating layer 110 may have a top surface that is substantially coplanar with the top surface of the gate capping pattern GP and the top surface of the gate spacer GS. A second interlayer insulating layer 120 may be formed on the first interlayer insulating layer 110 to cover the gate capping pattern GP. In an embodiment, at least one of the first and second interlayer insulating layers 110 and 120 may include a silicon oxide layer.

A pair of dividing structures DB, which are opposite to each other in the second direction D2, may be provided at both sides of the logic cell LC. The dividing structure DB may be extended in the first direction D1 and parallel to the gate electrodes GE. A pitch between the dividing structure DB and the gate electrode GE adjacent to each other may be equal to the first pitch P1.

The dividing structure DB may be provided to penetrate the first and second interlayer insulating layers 110 and 120 and may be extended into the first and second active patterns AP1 and AP2. The dividing structure DB may penetrate an upper portion of each of the first and second active patterns AP1 and AP2. The dividing structure DB may separate the PMOSFET and NMOSFET regions PR and NR of the logic cell LC from an active region of another logic cell adjacent thereto.

The upper portion of each of the first and second active patterns AP1 and AP2 may further include sacrificial layers SAL adjacent to the dividing structure DB. The sacrificial layers SAL may be stacked to be spaced apart from each other. Each of the sacrificial layers SAL may be located at the same level as a corresponding one of the first to third portions PO1, PO2, and PO3 of the gate electrode GE. The dividing structure DB may be provided to penetrate the sacrificial layers SAL.

The sacrificial layers SAL may be formed of or include silicon-germanium (SiGe). A germanium concentration of each of the sacrificial layers SAL may range from 10 at % to 30 at %. The germanium concentration of the sacrificial layer SAL may be higher than the germanium concentration of the first semiconductor layer SEL1 described above.

Active contacts AC may be provided to penetrate the first and second interlayer insulating layers 110 and 120 and may be electrically connected to the first and second source/drain patterns SD1 and SD2, respectively. A pair of the active contacts AC may be respectively provided at both sides of the gate electrode GE. When viewed in a plan view, the active contact AC may have a bar shape elongated in the first direction D1.

The active contact AC may be a self-aligned contact. For example, the active contact AC may be formed by a self-alignment process using the gate capping pattern GP and the gate spacer GS. In an embodiment, the active contact AC may cover at least a portion of a side surface of the gate spacer GS. Although not shown, the active contact AC may be provided to cover a portion of the top surface of the gate capping pattern GP.

Silicide patterns SC may be respectively interposed between the active contact AC and the first source/drain pattern SD1 and between the active contact AC and the second source/drain pattern SD2. The active contact AC may be electrically connected to the source/drain pattern SD1 or SD2 through the silicide pattern SC. The silicide pattern SC may be formed of or include at least one of metal silicide materials (e.g., titanium silicide, tantalum silicide, tungsten silicide, nickel silicide, and cobalt silicide).

A gate contact GC, which is electrically connected to the gate electrode GE, may be provided to penetrate the second interlayer insulating layer 120 and the gate capping pattern GP. Referring to FIG. 2B, an upper region of each of the active contacts AC adjacent to the gate contact GC may be filled with an upper insulating pattern UIP. Accordingly, it may be possible to prevent a process failure (e.g., a short circuit), which may occur when the gate contact GC is in contact with the active contact AC adjacent thereto.

Each of the active and gate contacts AC and GC may include a conductive pattern FM and a barrier pattern BM enclosing the conductive pattern FM. For example, the conductive pattern FM may be formed of or include at least one metal of aluminum, copper, tungsten, molybdenum, or cobalt. The barrier pattern BM may be provided to cover side and bottom surfaces of the conductive pattern FM. In an embodiment, the barrier pattern BM may include a metal layer and a metal nitride layer. The metal layer may be formed of or include at least one of titanium, tantalum, tungsten, nickel, cobalt, or platinum. The metal nitride layer may include at least one of titanium nitride (TiN), tantalum nitride (TaN), tungsten nitride (WN), nickel nitride (NiN), cobalt nitride (CoN), or platinum nitride (PtN).

A first metal layer M1 may be provided in a third interlayer insulating layer 130. The first metal layer M1 may include first lower interconnection lines M1_R, second lower interconnection lines M1_I, and lower vias VI1. The lower vias VI1 may be provided below the first and second lower interconnection lines M1_R and M1_I.

Each of the first lower interconnection lines M1_R may be extended in the second direction D2 to cross the logic cell LC. Each of the first lower interconnection lines M1_R may be a power line. For example, a drain voltage VDD or a source voltage VSS may be applied to the first lower interconnection line M1_R.

Referring to FIG. 1, a first cell boundary CB1 extending in the second direction D2 may be defined in a region of the logic cell LC. A second cell boundary CB2 extending in the second direction D2 may be defined in a region of the logic cell LC opposite to the first cell boundary CB1. The first lower interconnection line M1_R, to which the drain voltage VDD (i.e., a power voltage) is applied, may be disposed on the first cell boundary CB1. The first lower interconnection line M1_R, to which the drain voltage VDD is applied, may be extended along the first cell boundary CB1 and in the second direction D2. The first lower interconnection line M1_R, to which the source voltage VSS (i.e., a ground voltage) is applied, may be disposed on the second cell boundary CB2. The first lower interconnection line M1_R, to which the source voltage VSS is applied, may be extended along the second cell boundary CB2 and in the second direction D2.

The second lower interconnection lines M1_I may be disposed between the first lower interconnection lines M1_R, to which the drain voltage VDD and the source voltage VSS are respectively applied, in the first direction D1. Each of the second lower interconnection lines M1_I may be a line- or bar-shaped pattern extending in the second direction D2. The second lower interconnection lines M1_I may be arranged to be spaced apart from each other with a second pitch P2 in the first direction D1. The second pitch P2 may be smaller than the first pitch P1.

The lower vias VI1 may be provided below the first and second lower interconnection lines M1_R and M1_I of the first metal layer M1. The lower vias VI1 may be respectively interposed between the active contacts AC and the first and second lower interconnection lines M1_R and M1_I. The lower vias VI1 may be respectively interposed between the gate contacts GC and the second lower interconnection lines M1_I.

The lower interconnection line M1_R or M1_I of the first metal layer M1 and the lower via VI1 thereunder may be formed by separate processes. In other words, each of the lower interconnection line M1_R or M1_I and the lower via VI1 may be a single damascene process. The semiconductor device according to the present embodiment may be fabricated using a sub-20 nm process.

A second metal layer M2 may be provided in a fourth interlayer insulating layer 140. The second metal layer M2 may include upper interconnection lines M2_I. Each of the upper interconnection lines M2_I may be a line- or bar-shaped pattern extending in the first direction D1. In other words, the upper interconnection lines M2_I may be extended in the first direction D1 to be parallel to each other. When viewed in a plan view, the upper interconnection lines M2_I may be parallel to the gate electrodes GE. The upper interconnection lines M2_I may be arranged with a third pitch P3 in the second direction D2. The third pitch P3 may be smaller than the first pitch P1. The third pitch P3 may be larger than the second pitch P2.

The second metal layer M2 may further include upper vias VI2. The upper vias VI2 may be provided below the upper interconnection lines M2_I. The upper vias VI2 may be respectively interposed between the lower interconnection lines M1_R and M1_I and the upper interconnection lines M2_I.

The upper interconnection line M2_I of the second metal layer M2 and the upper via VI2 thereunder may be formed by the same process and may form a single object. In other words, the upper interconnection line M2_I of the second metal layer M2 and the upper via VI2 may be formed by a dual damascene process.

The lower interconnection lines M1_R and M1_I of the first metal layer M1 and the upper interconnection lines M2_I of the second metal layer M2 may be formed of or include the same material or different conductive materials. For example, the lower interconnection lines M1_R and M1_I and the upper interconnection lines M2_I may be formed of or include at least one of metallic materials (e.g., aluminum, copper, tungsten, molybdenum, or cobalt).

In an embodiment, although not shown, additional metal layers (e.g., M3, M4, M5, and so forth) may be further stacked on the fourth interlayer insulating layer 140. Each of the stacked metal layers may include routing lines.

Figure 2A:
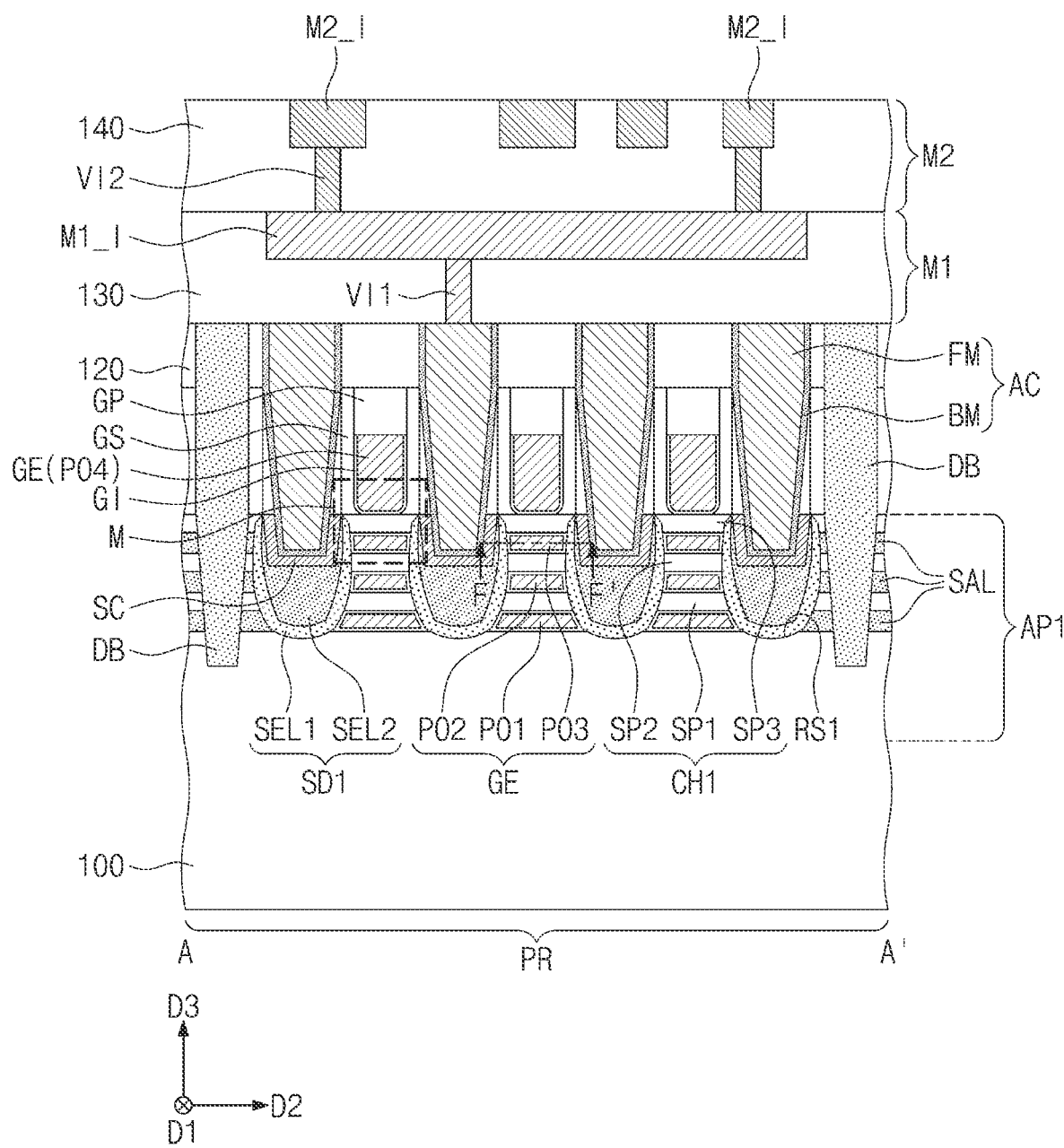
FIGS. 2A, 3, 4A, 5, and 6 are cross-sectional views respectively taken along lines A-A', B-B', C-C', D-D', and E-E' of FIG. 1.
Figure 2B:
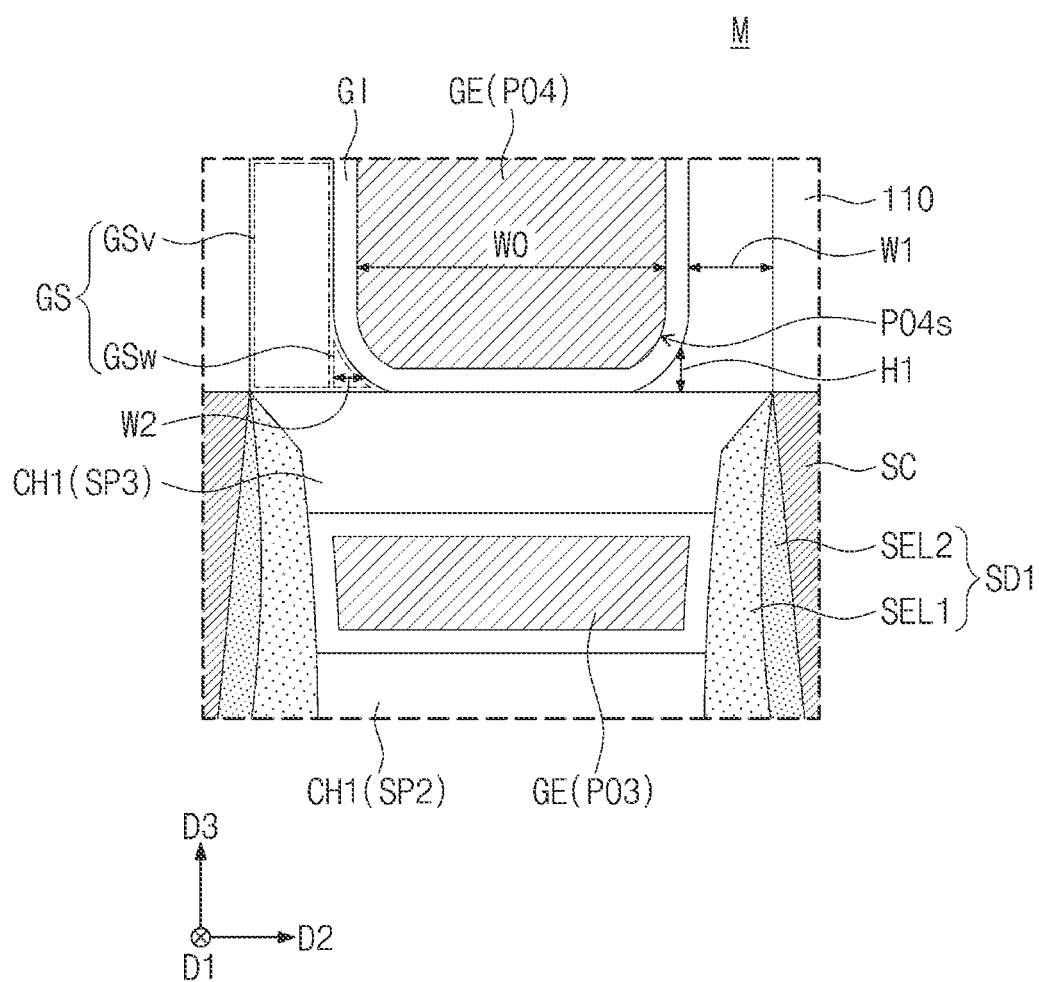
FIG. 2B is an enlarged cross-sectional view illustrating a portion M of FIG. 2A.
Figure 2C:
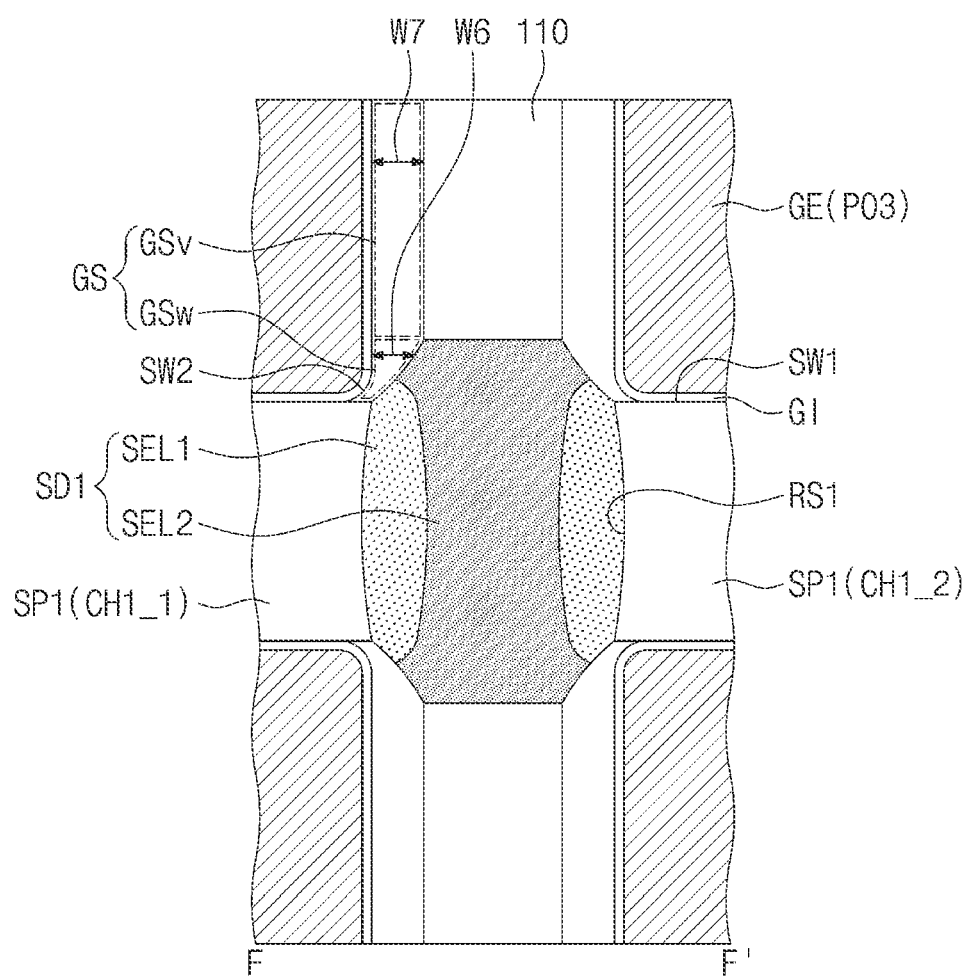
FIG. 2C is a top plan view taken along a line F-F' of FIG. 2A.
Figure 3:
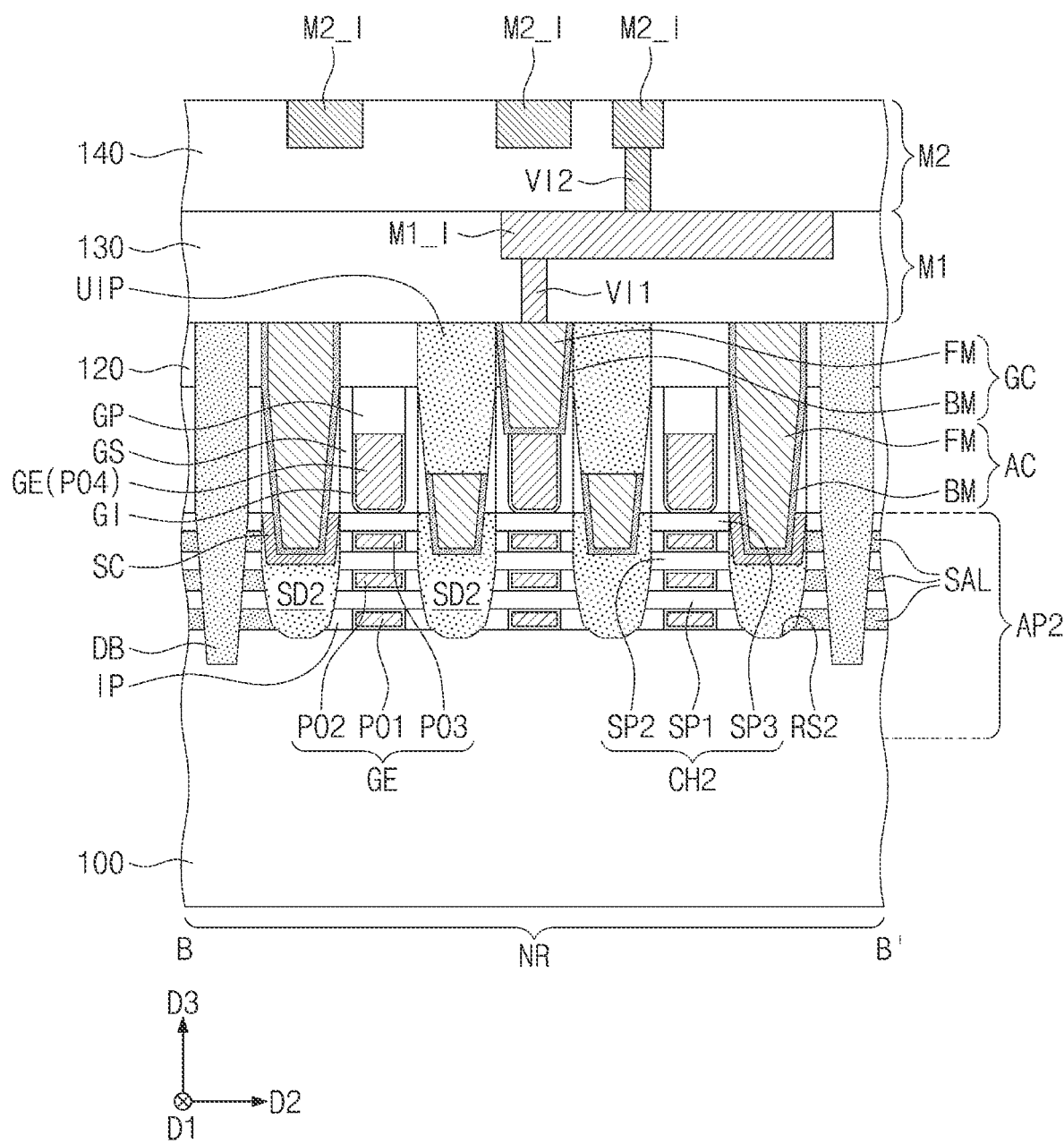

FIG. 2B is an enlarged cross-sectional view illustrating a highlighted portion M of FIG. 2A. FIG. 2C is a top plan view taken along a line F-F' of FIG. 2A. FIG. 4B is an enlarged cross-sectional view illustrating a portion N of FIG. 4A. Referring to FIGS. 2A and 2B, the gate electrode GE may be provided in the first active region PR. In the first and second active regions PR and NR, the gate electrode GE may include the first portion PO1 interposed between the substrate 100 and the first semiconductor pattern SP1, the second portion PO2 interposed between the first semiconductor pattern SP1 and the second semiconductor pattern SP2, the third portion PO3 interposed between the second semiconductor pattern SP2 and the third semiconductor pattern SP3, and the fourth portion PO4 provided on the third semiconductor pattern SP3. A width W0 of the fourth portion PO4 of the gate electrode GE in the second direction D2 may decrease with decreasing distance from the first channel pattern CH1. More specifically, a corner portion PO4s, at which side and bottom surfaces of a lower portion of the fourth portion PO4 are connected, may be convex toward the first source/drain pattern SD1 adjacent thereto. Accordingly, when viewed in a cross-sectional view, the lower portion of the fourth portion PO4 adjacent to the first channel pattern CH1 may have a rectangular shape with rounded corners.

The gate insulating layer GI may be provided on the side and bottom surfaces of the fourth portion PO4 of the gate electrode GE. The gate insulating layer GI may conformally cover the side and bottom surfaces of the fourth portion PO4 of the gate electrode GE. For example, the gate insulating layer GI may have a profile corresponding to the side, bottom, and corner surfaces of the fourth portion PO4 of the gate electrode GE.

The gate spacer GS may be provided on a sidewall of the fourth portion PO4 of the gate electrode GE. The gate spacer GS may be vertically extended along the sidewall of the fourth portion PO4 of the gate electrode GE. More specifically, the gate spacer GS may include a first portion GSv, which is vertically extended, and a second portion GSw, which protrudes toward the gate electrode GE adjacent thereto. The first portion GSv may be extended in the third direction D3 and parallel to the sidewall of the fourth portion PO4 of the gate electrode GE. As shown, a width W1 of the first portion GSv in the second direction D2 may be substantially constant. The second portion GSw may be connected to the first portion GSv and may be provided between a lower portion of the first portion GSv and the gate insulating layer GI. The second portion GSw may be extended from the first portion GSv toward a contact surface between the gate insulating layer GI and the uppermost semiconductor pattern SP3. The second portion GSw may be vertically overlapped with the gate insulating layer GI. As shown, a nonuniform width W2 of the second portion GSw in the second direction D2 may increase with decreasing distance from the uppermost semiconductor pattern SP3 and, for example, may range from 1 nm to 5 nm. A height H1 of the second portion GSw in the third direction D3 may decrease with decreasing distance from the gate electrode GE. The gate electrode GE and the gate spacer GS in the second active region NR may be configured to have substantially the same features as those described with reference to the FIG. 2B.

The planar structure of the gate spacer GS in the first and second active regions PR and NR will be described in more detail with reference to FIG. 2C. Referring to FIG. 2C, first and second channel patterns CH1_1 and CH1_2 may be provided on the first active region PR to be spaced apart from each other in the second direction D2. Each of the first and second channel patterns CH1_1 and CH1_2 may include the first to third semiconductor patterns SP1, SP2, and SP3, which are sequentially stacked. The first source/drain pattern SD1 may be provided between the first and second channel patterns CH1_1 and CH1_2. The gate electrodes GE may be extended in the first direction D1 to cross each of the first and second channel patterns CH1_1 and CH1_2. For the sake of simplicity, the description that follows will refer to just one gate electrode GE.

More specifically, the gate electrode GE may be aligned to the first semiconductor pattern SP1 in the first direction D1. A corner portion of the gate electrode GE adjacent to the first source/drain pattern SD1 may have a curved surface that is convex toward the first source/drain pattern SD1. The gate insulating layer GI may be interposed between the first semiconductor pattern SP1 and the gate electrode GE and between the gate electrode GE and the gate spacer GS.

The gate spacer GS may be provided on a sidewall of the gate electrode GE. The gate spacer GS may include the first portion GSv, which is provided on the sidewall of the gate electrode GE, and the second portion GSw, which protrudes in a region between the first semiconductor pattern SP1 and the gate electrode GE. The first portion GSv may be extended along the sidewall of the gate electrode GE and in the first direction D1 and may have a constant width W7 in the second direction D2. As an example, the first portion GSv may be a portion of the gate spacer GS, which is not in contact with the first source/drain pattern SD1, but the inventive concept is not limited to this example.

The second portion GSw may be connected to the first portion GSv and may be provided between the first semiconductor pattern SP1 and the gate electrode GE and between the first source/drain pattern SD1 and the gate electrode GE. The second portion GSw may be in contact with the gate insulating layer GI, the first source/drain pattern SD1, and the first semiconductor pattern SP1, which are positioned adjacent thereto. A contact surface SW2 between the second portion GSw and the gate insulating layer GI may be a curved surface that is convex toward the first source/drain pattern SD1. A width W6 of the second portion GSw in the second direction D2 may decrease with decreasing distance from the first semiconductor pattern SP1. For example, the width W6 of the second portion GSw in the second direction D2 may range from 1 nm to 5 nm. The first source/drain pattern SD1 may be spaced apart from the gate electrode GE with the second portion GSw interposed therebetween. The gate electrode GE and the gate spacer GS in the second active region NR may be configured to have substantially the same features as those described with reference to FIG. 2C.

According to an embodiment of the inventive concept, the gate spacer GS may include the first portion GSv, which is extended parallel to the sidewall of the gate electrode GE, and the second portion GSw, which protrudes toward the gate electrode GE. The source/drain patterns SD1 and SD2 adjacent to the gate spacer GS may be spaced apart from the gate electrode GE by the second portion GSw of the gate spacer GS. In the present embodiment, the second portion GSw may be formed to have a sufficient thickness or to separate the source/drain patterns SD1 and SD2 from the gate electrode GE by a sufficient distance. Accordingly, it may be possible to improve an electric insulating property between the gate electrode GE and the source/drain patterns SD1 and SD2 and thereby to improve electric characteristics of the semiconductor device. Although not shown, the inventive concept may be applied to not only a MBCFET device but also a FINFET device including an eSiGe layer.

The gate electrode GE and the gate spacer GS on the field region FR will be described in more detail with reference to FIG. 4B. Referring to FIG. 4B in conjunction with FIG. 4A, in the field region FR, the gate electrode GE may be provided on the device isolation layer ST. A lower portion of the gate electrode GE may have a width W3, which decreases with decreasing distance from a top surface 100a of the substrate 100, in the second direction D2. More specifically, a bottom surface GEb of the gate electrode GE may be convex toward the top surface 100a of the substrate 100. Thus, in the field region FR, the bottom surface GEb of the gate electrode GE may have a 'U' shape.

The gate insulating layer GI may be provided on a side surface GEs and a bottom surface GEb of the gate electrode GE. The gate insulating layer GI may be interposed between the gate electrode GE and the gate spacer GS and between the gate electrode GE and the device isolation layer ST. The gate insulating layer GI may conformally cover the side and bottom surfaces GEs and GEb of the gate electrode GE. More specifically, the gate insulating layer GI may have a profile corresponding to the side and bottom surfaces GEs and GEb of the gate electrode GE.

The gate spacer GS may be provided on the sidewall of the gate electrode GE. More specifically, the gate spacer GS may be interposed between the gate electrode GE and the first interlayer insulating layer 110, which are positioned adjacent to each other. The gate spacer GS may be vertically extended along the side surface GEs of the gate electrode GE.

More specifically, the gate spacer GS may include a first "upper" portion GSU and a second "bottom" portion GSB provided under the first portion GSU. The first portion GSU may be extended parallel to the side surface GEs of the gate electrode GE. The first portion GSU may have a constant width W4 in the second direction D2. The second portion GSB may be connected to the first portion GSU. The second portion GSB may have a width W5 in the second direction D2, and here, the width W5 may vary when measured along a path parallel to the third direction D3. For example, with decreasing distance from the top surface 100a of the substrate 100, the width W5 of the second portion GSB in the second direction D2 may be increased until it reaches its largest width, and then, may be decreased.

A bottom surface GSBb of the second portion GSB may be inclined at an angle to the top surface 100a of the substrate 100. More specifically, a vertical level of the bottom surface GSBb of the second portion GSB may be elevated with decreasing distance from the gate electrode GE. The lowermost level of the second portion GSB may be a first level Iv1, and the first level Iv1 may be the lowermost level of the gate spacer GS in the field region FR. The lowermost level of the gate electrode GE may be a second level Iv2, and the second level Iv2 may be the lowermost level of the gate electrode GE in the field region FR. According to an embodiment of the inventive concept, the lowermost level Iv2 of the gate electrode GE may be lower than the lowermost level Iv1 of the gate spacer GS. In the field region FR, a height H2 of the gate electrode GE in the third direction D3 may range from 50 nm to 100 nm (e.g., see FIG. 4A).

Thus, as illustrated hereinabove with respect to FIGS. 1, 2A-2C, 3, 4A-4B and 5-6, a n integrated circuit device may include a substrate 100, a first semiconductor active region AP1 of first conductivity type (e.g., P-type) on a first portion (PR) of the substrate 100, and a second semiconductive active region AP2 of second conductivity type (e.g., N-type) on a second portion (NR) of the substrate 100, which is separated from the first semiconductor active region AP1 by an electrically insulating field isolation region FR. A first pair of source/drain regions SD1 are provided on the first active region AP1, and a second pair of source/drain regions SD2 are provided on the second active region AP2. A first stack of vertically spaced-apart channel regions CH1 are provided, which extend between the first pair of source/drain regions SD1, and a second stack of vertically spaced-apart channel regions CH2 are provided, which extend between the second pair of source/drain regions SD2. A gate electrode GE is provided, which extends on the first stack of vertically spaced-apart channel regions CH1, the field isolation region FR, and the second stack of vertically spaced-apart channel regions CH2.

As shown best by FIG. 4B, the gate electrode GE has a width that is tapered so that a width of a lower portion of the gate electrode GE decreases with decreasing distance from an underlying portion of the field isolation region ST. An electrically insulating gate spacer GS is provided on a sidewall of the gate electrode GE. The gate spacer GS has a bottom surface GSBb that is angled relative to an upper surface of the substrate 100. The gate spacer GS is separated from the sidewall of the gate electrode GE by a gate insulating layer GI; and the bottom surface GSBb of the gate spacer GS intersects a sidewall of the gate insulating layer GI at an acute angle. The gate spacer GS on the field isolation region ST includes an upper spacer region GSU having a uniform width, and a lower spacer region GSB, which extends between the upper spacer region GSU and the substrate 100 and has a nonuniform width that generally widens in the "downward" direction towards the upper surface of the substrate 100. In addition, a lowermost portion of the gate electrode GE (in FIG. 4B) extends deeper into the field isolation region ST relative to the electrically insulating gate spacer GS.

Figure 5:
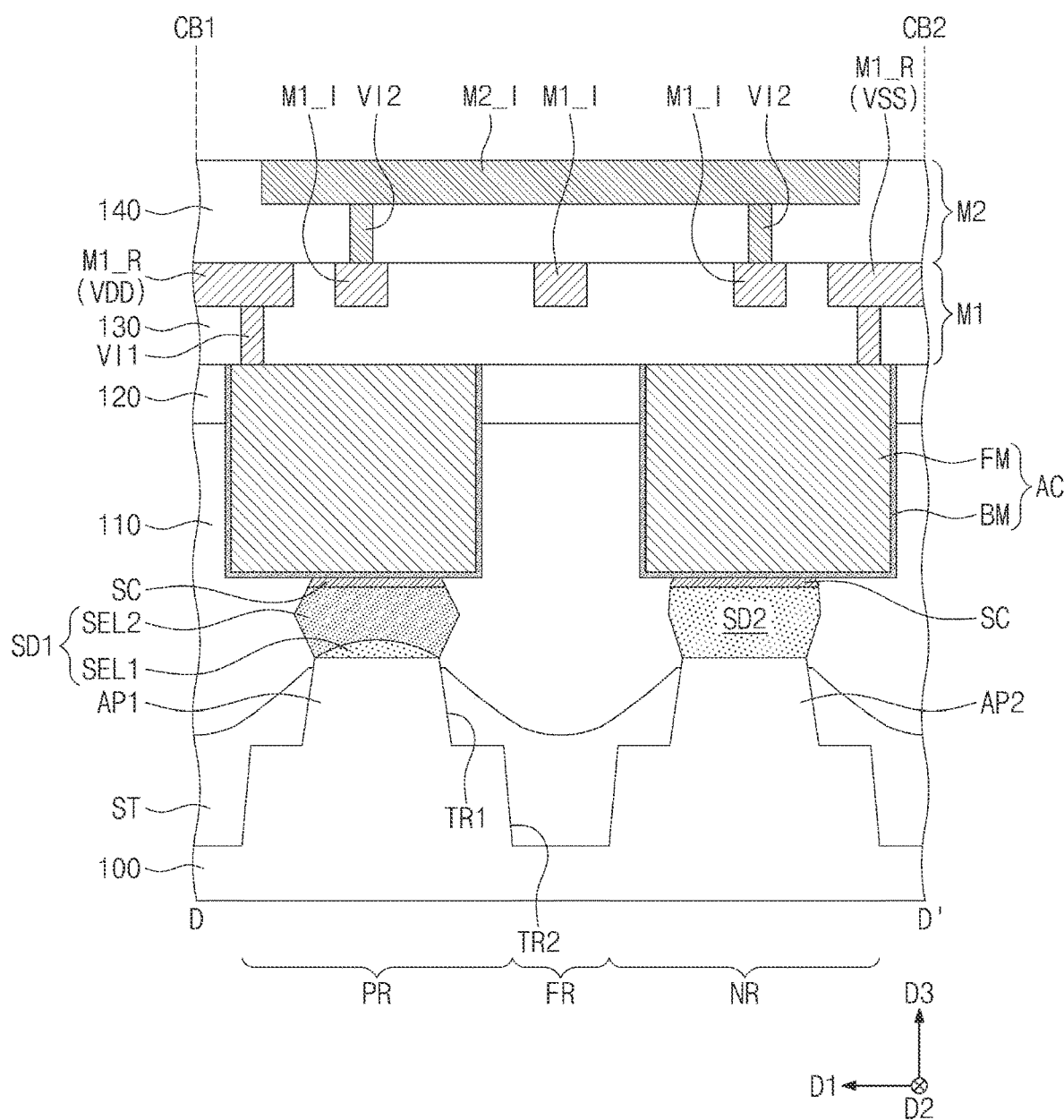
Figure 6:
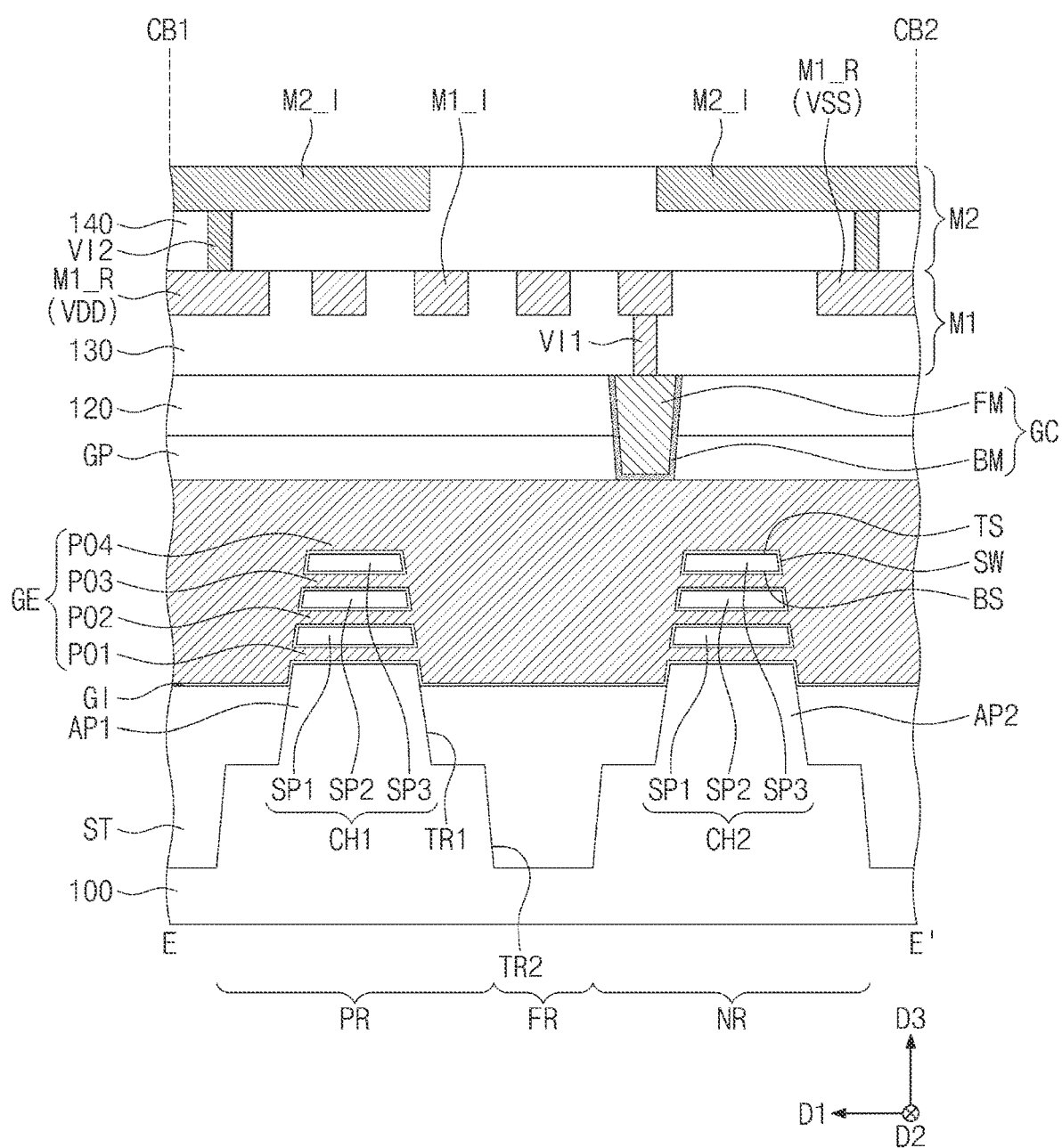

As will be understood by those skilled in the art, the first pair of source/drain regions SD1 and the first stack of vertically spaced-apart channel regions CH1, as shown by FIGS. 5-6, are components of an PMOS transistor. In contrast, the second pair of source/drain regions SD2 and the second stack of vertically spaced-apart channel regions CH2 are components of an NMOS transistor. Thus, a first section of the gate electrode GE operates as a gate terminal of the PMOS transistor and a second section of the gate electrode GE operates as a gate terminal of the NMOS transistor. And, as shown best by FIG. 6, each of the spaced-apart channel regions (SP1, SP2, SP3) within the first stack are surrounded by the gate insulating layer GI. As shown by FIG. 2B, a lowermost portion of the second section of the gate electrode GE (PO4) is spaced farther from an uppermost one of the channel regions SP3 in the first stack relative to the electrically insulating gate spacer GS (GSv, GSw) on the sidewall of the second section of the gate electrode GE. In addition, the gate insulating layer GI extends between the second section of the gate electrode GE and the uppermost one of the channel regions SP3 in the first stack CH1, and a bottom surface the electrically insulating gate spacer GS (GSv, GSw) and a bottom surface of the gate insulating layer GI contact the uppermost one of the channel regions SP3 in the first stack CH1.

Figure 18:
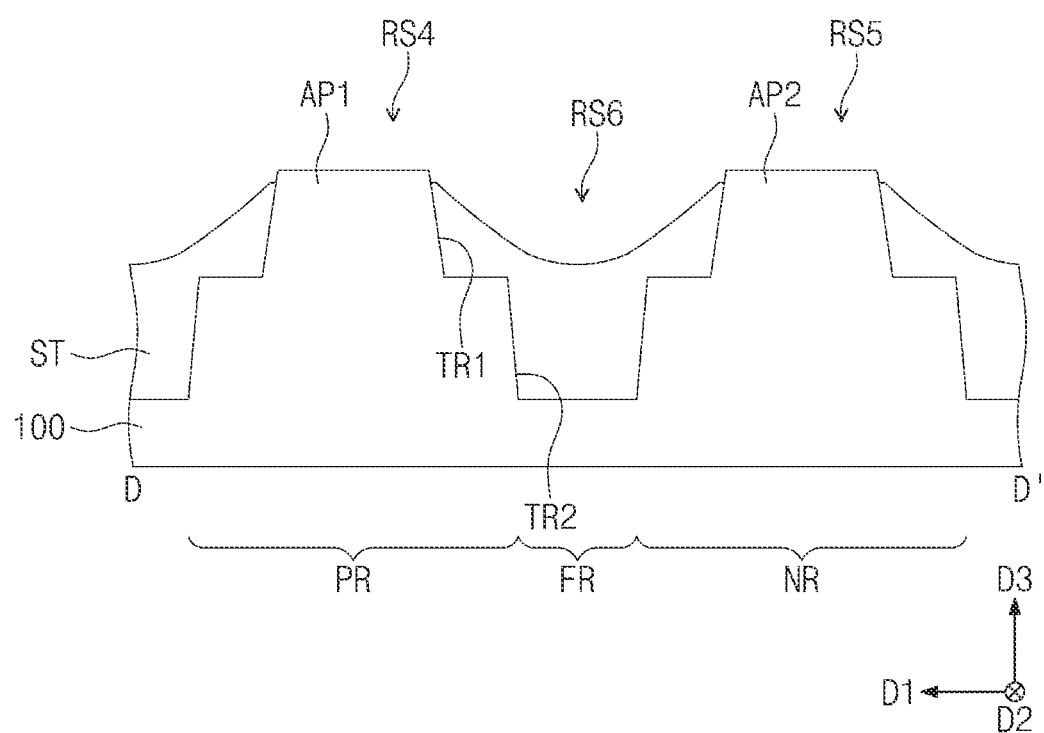
Figure 19:
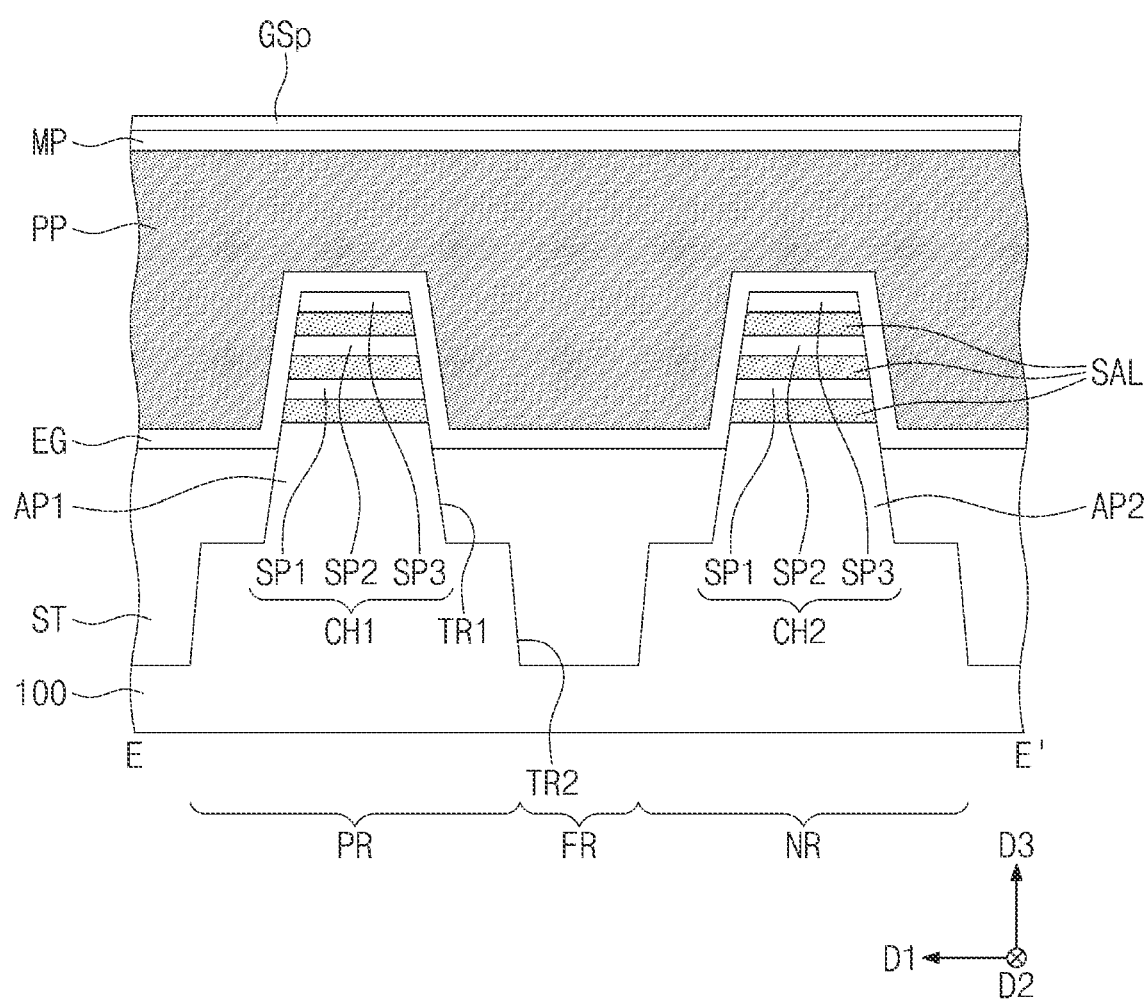
Figure 20:
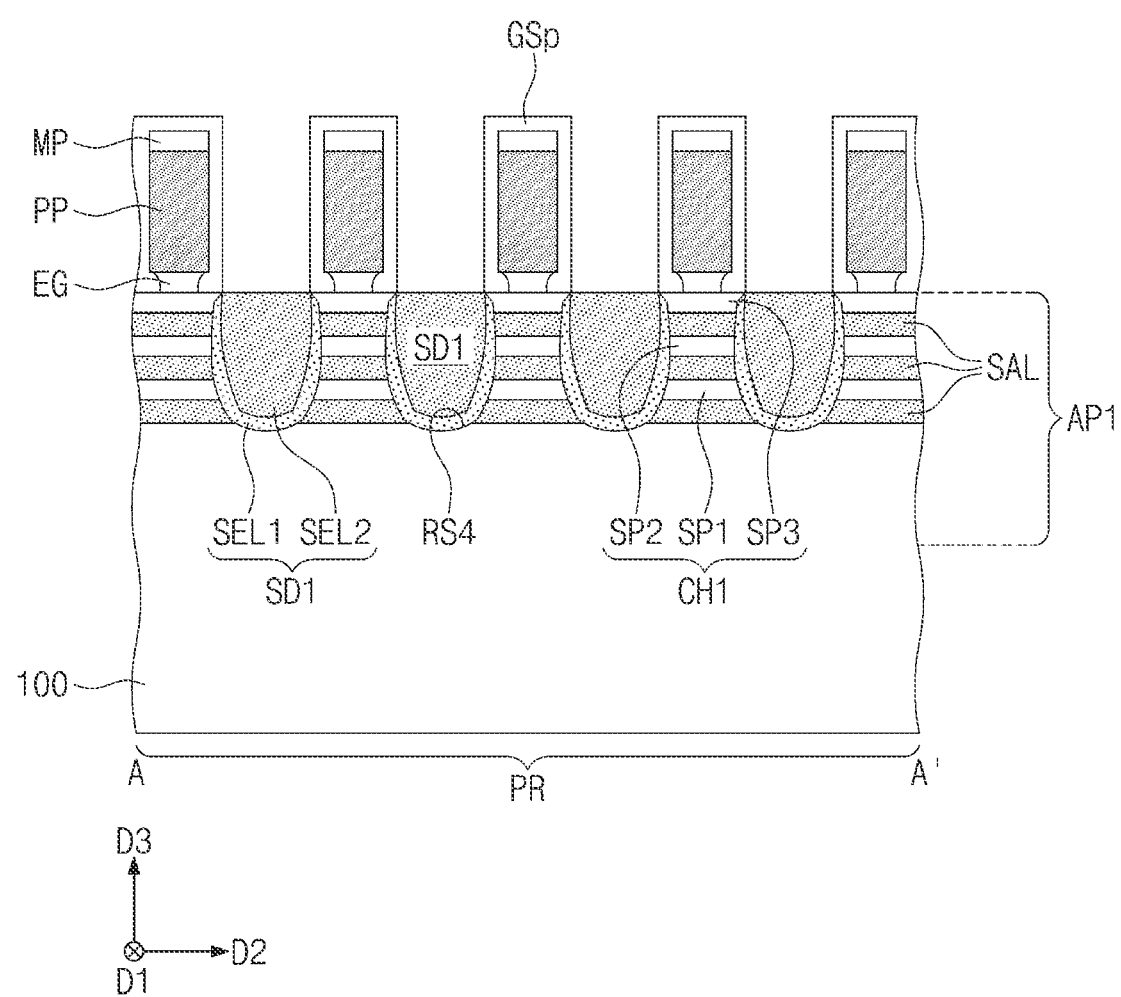
Figure 21:
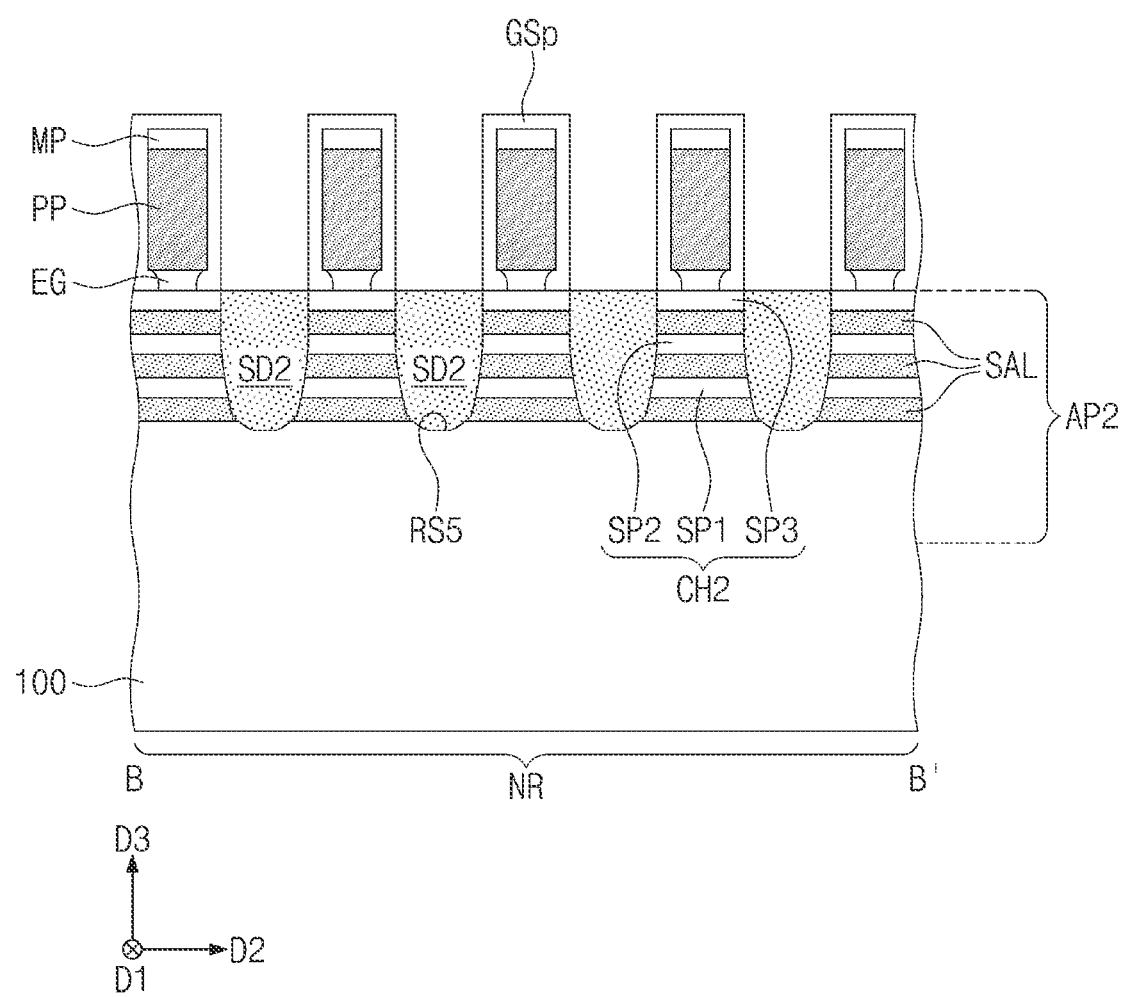
Figure 22:
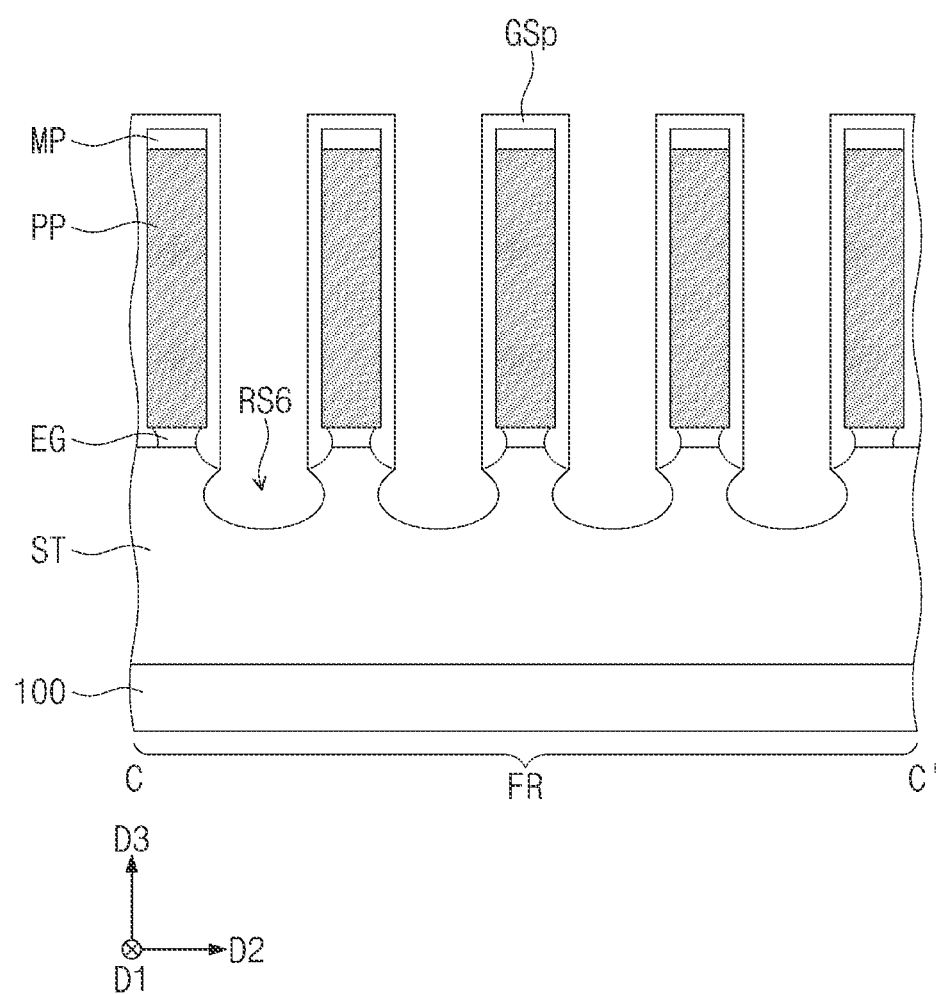
Figure 23:
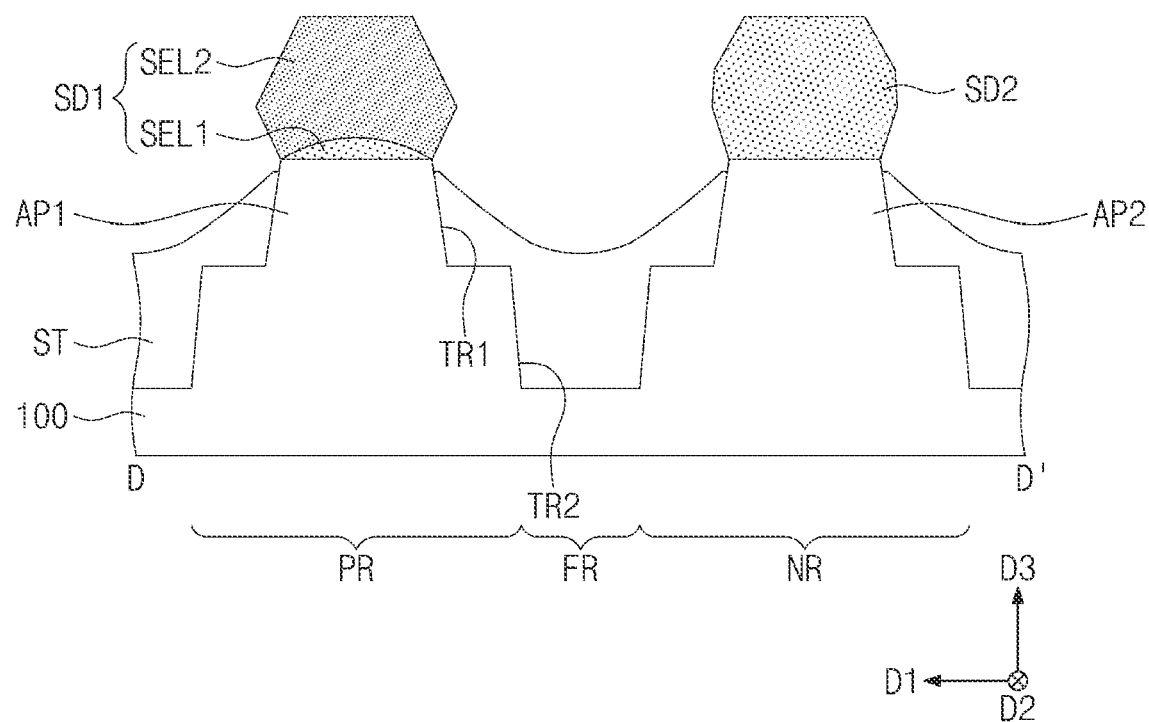
Figure 24:
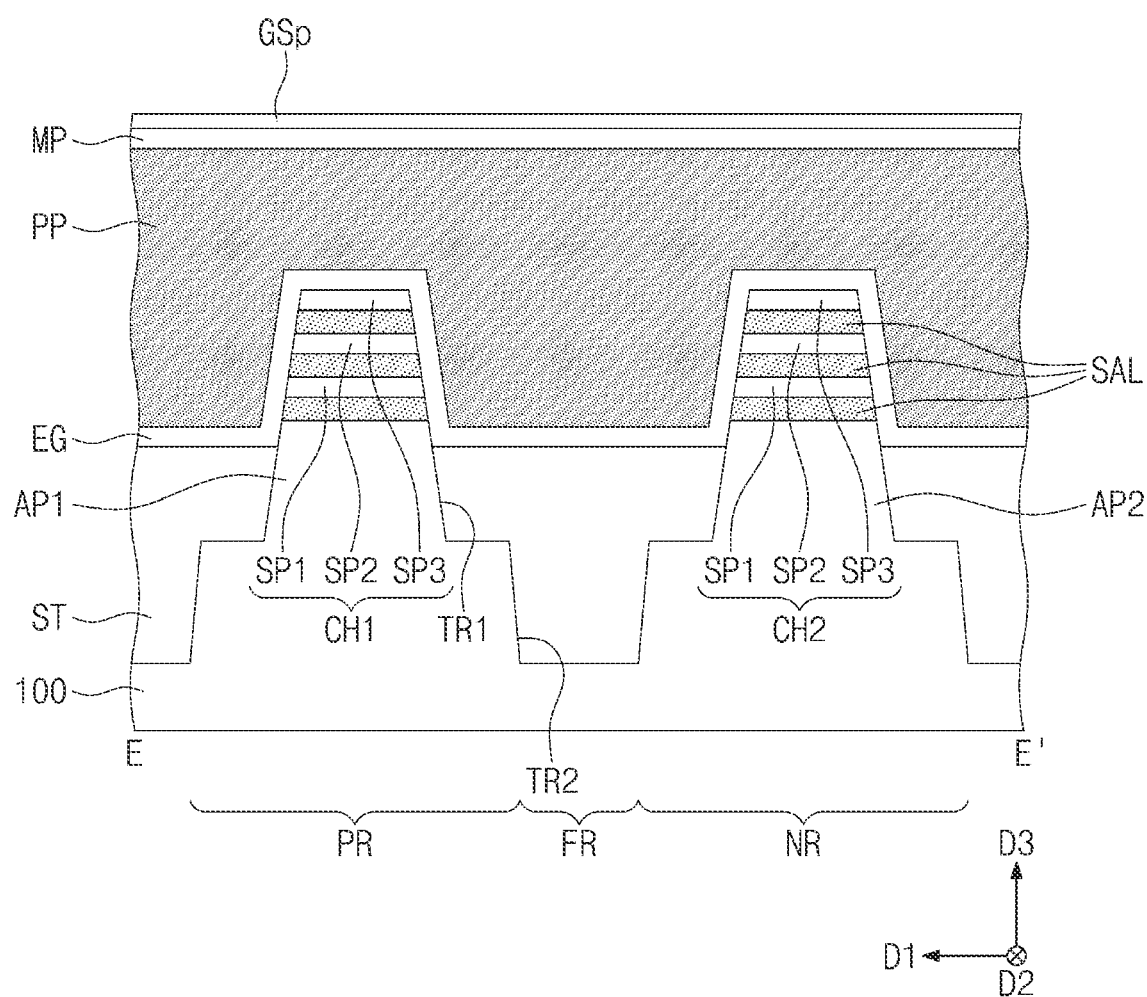
Figure 25:
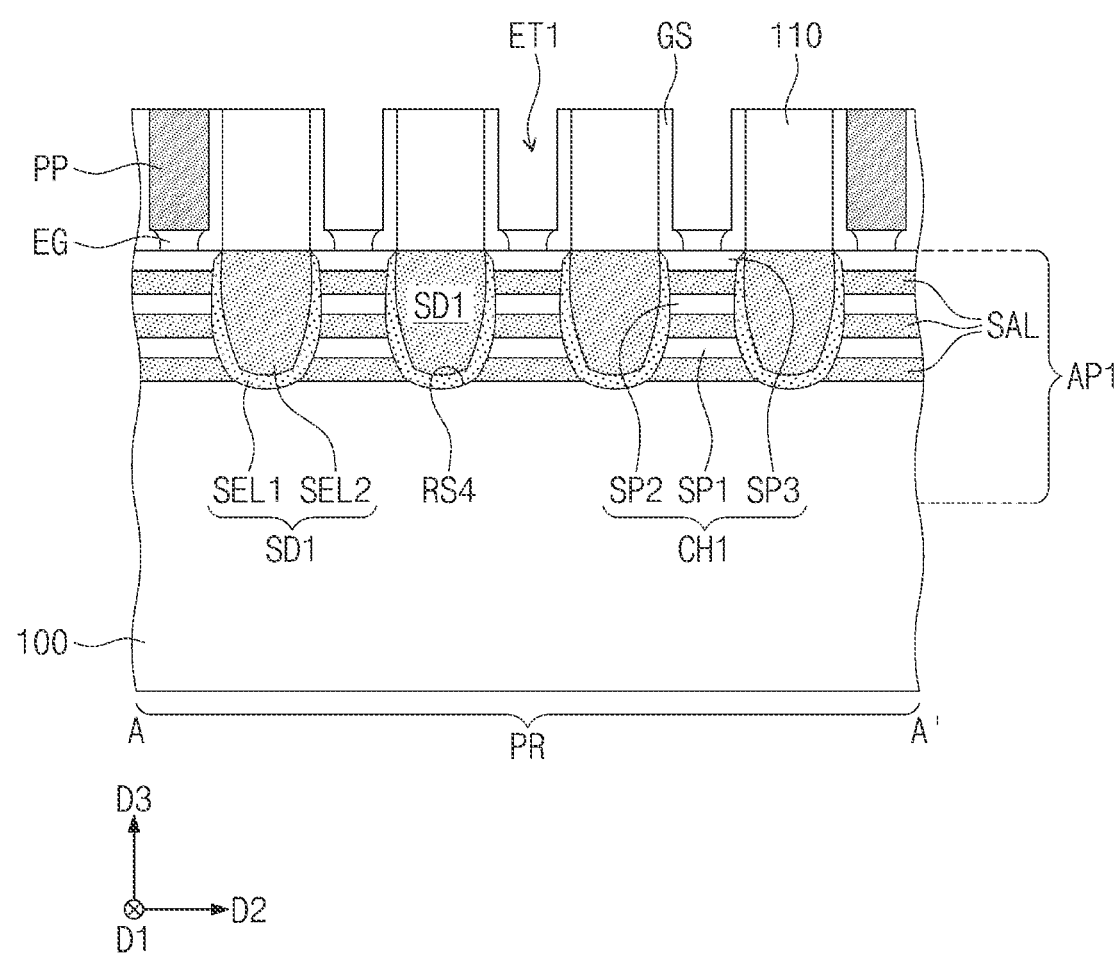
Figure 26:
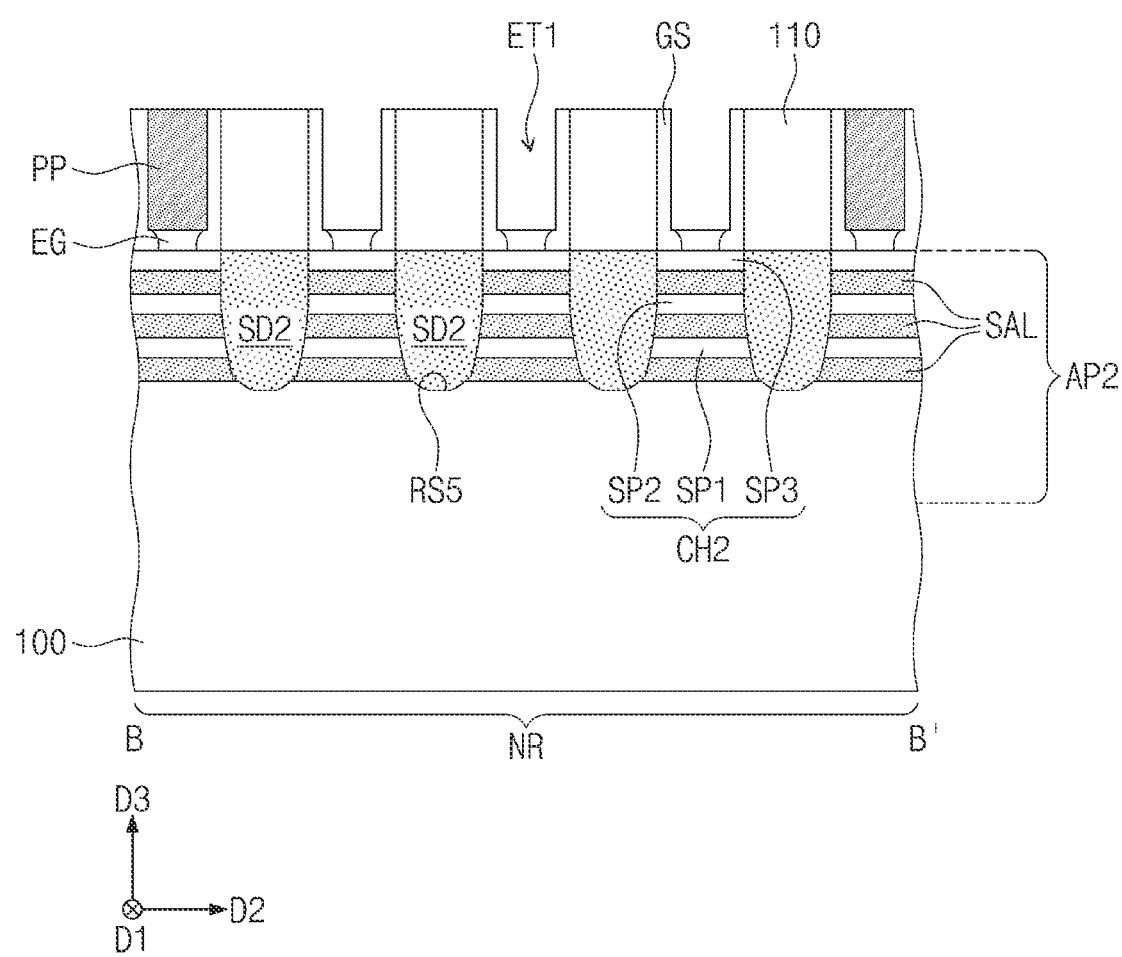
Figure 27:
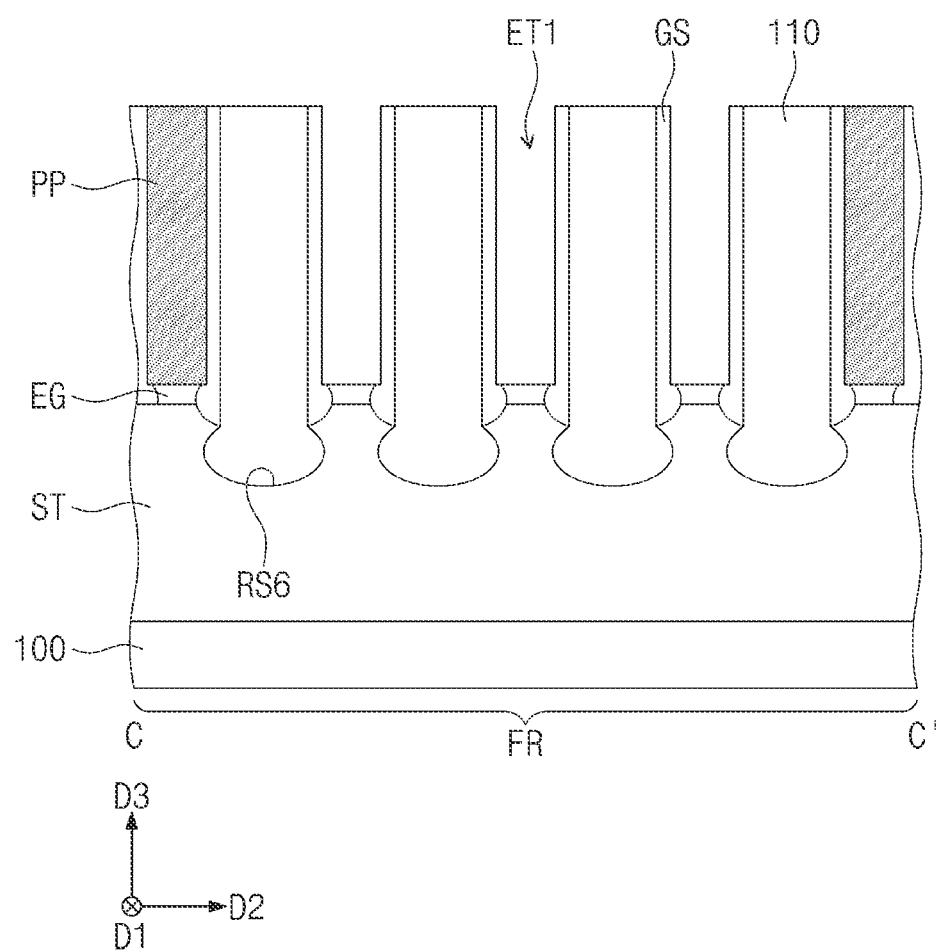
Figure 28:
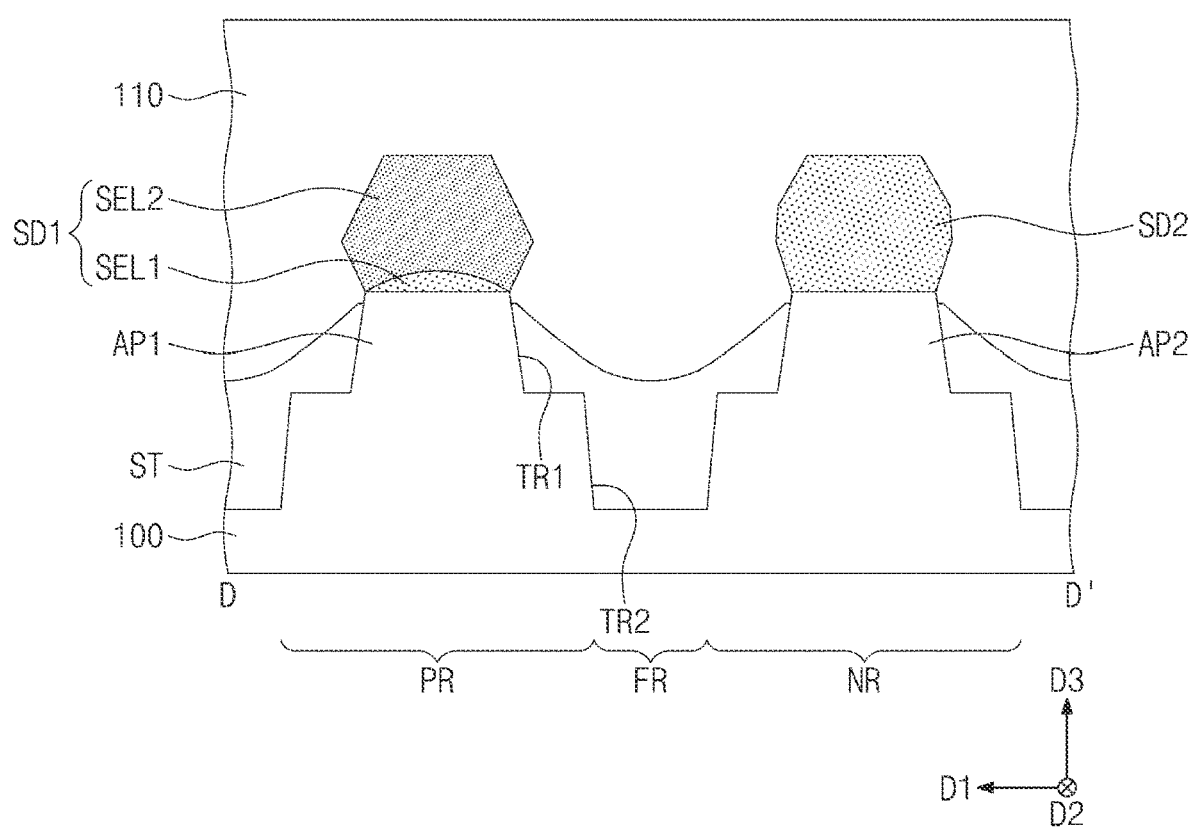
Figure 29:
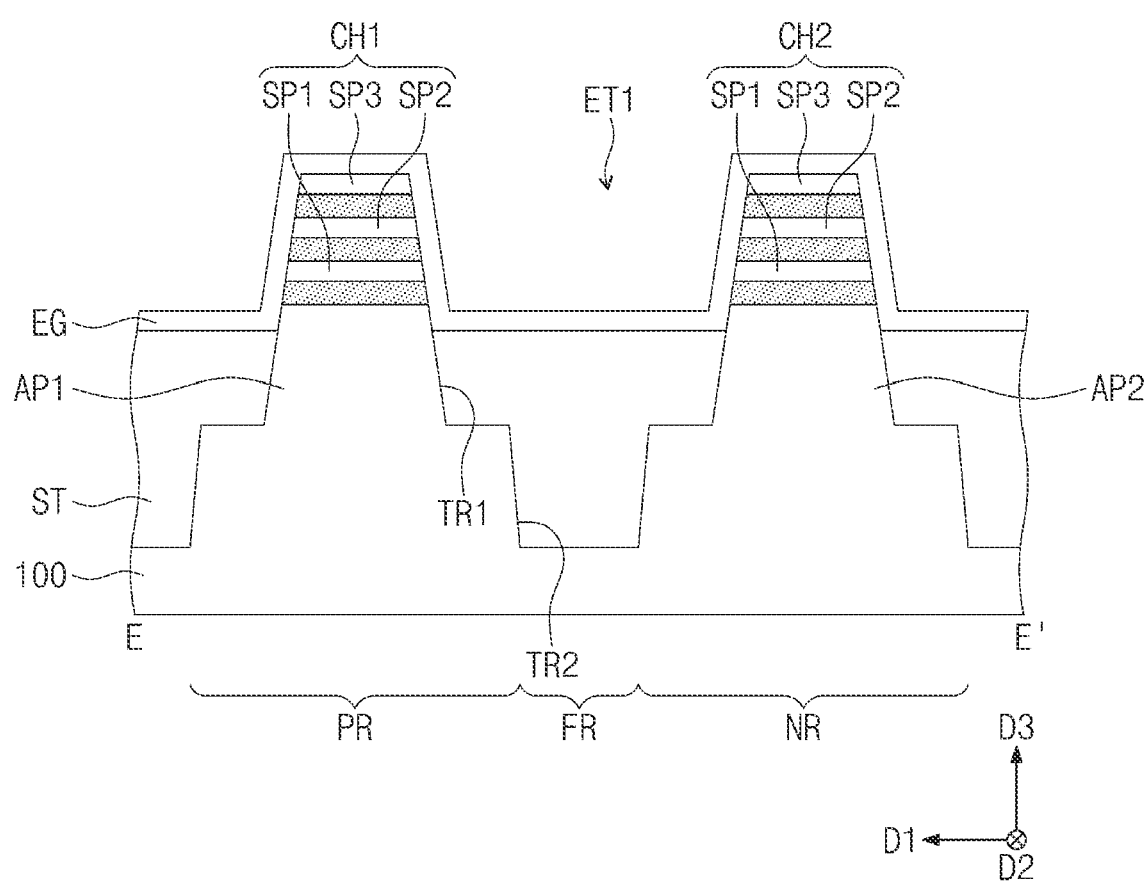
Figure 30:
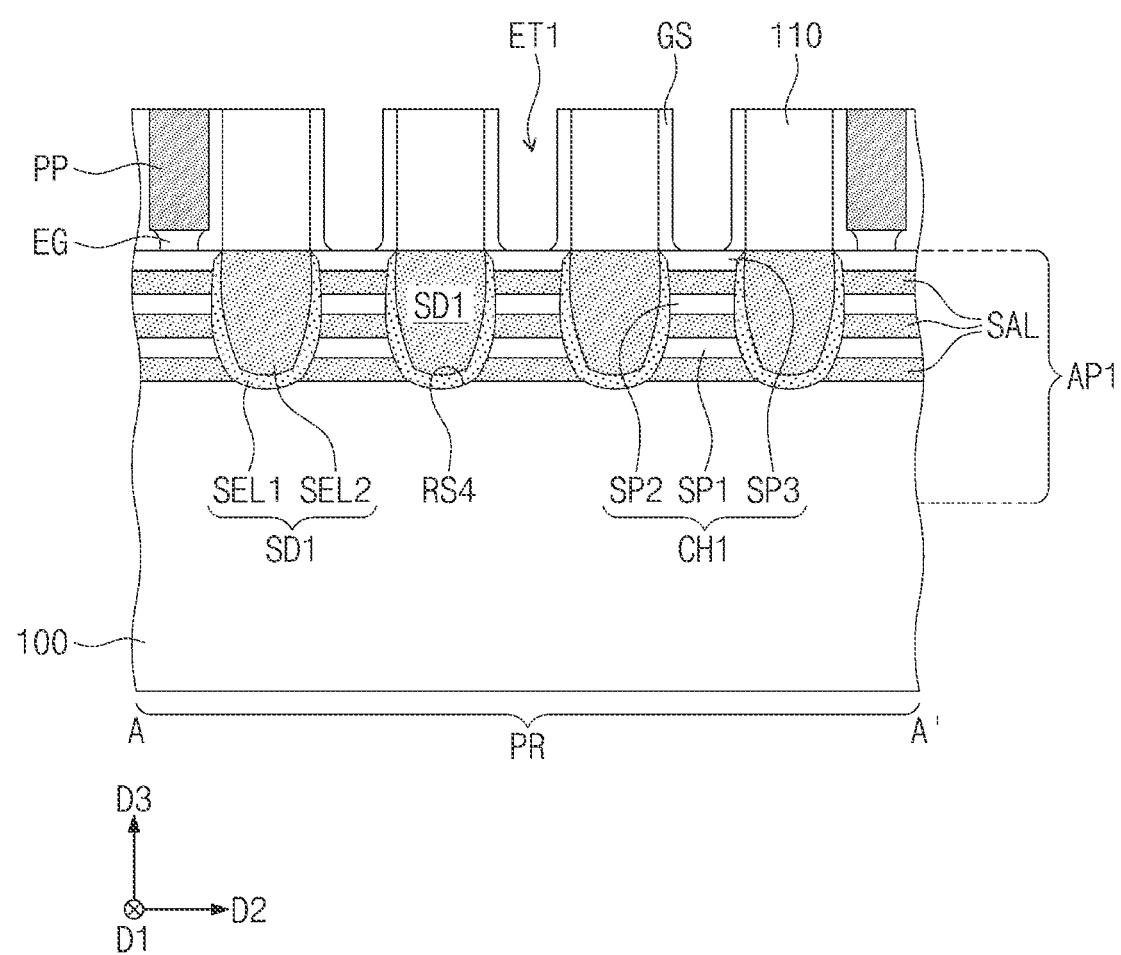
Figure 31:
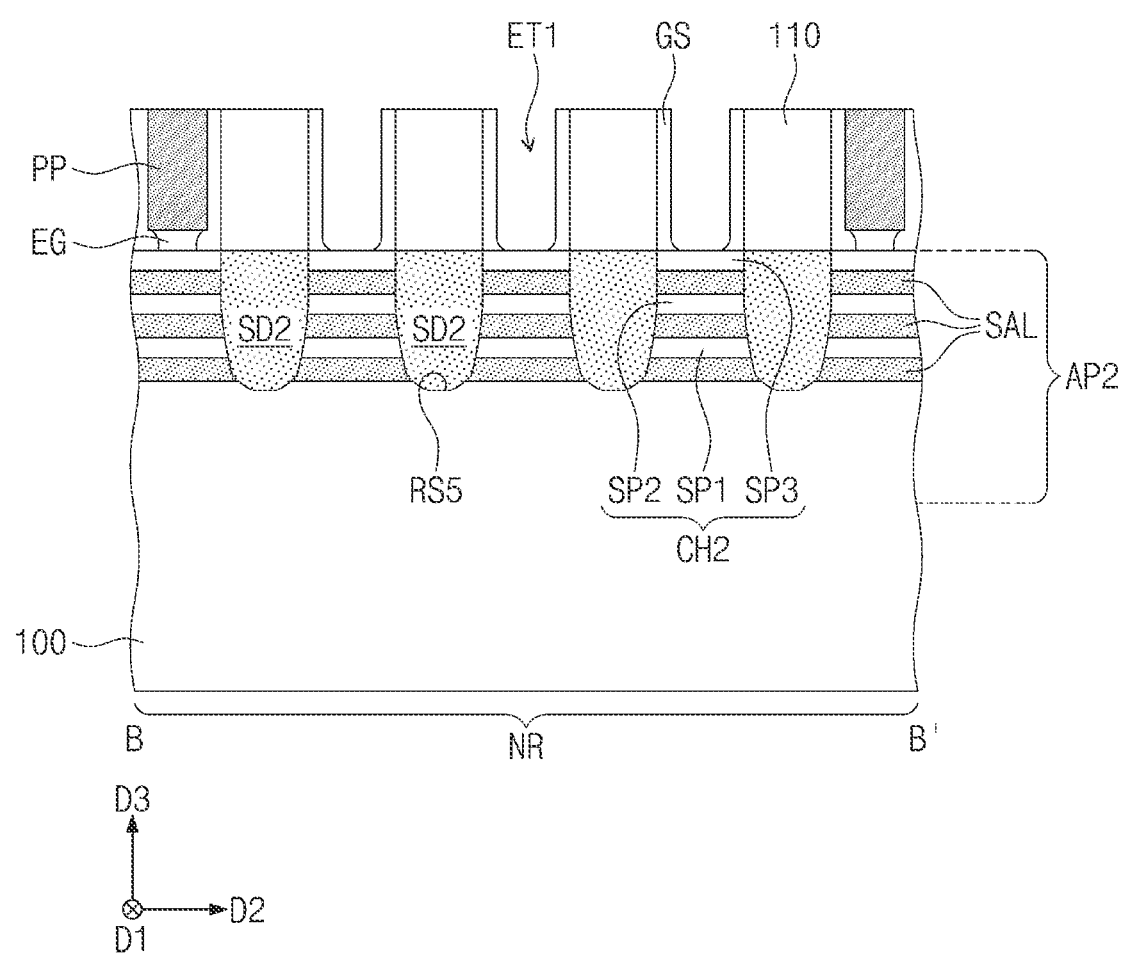
Figure 32:
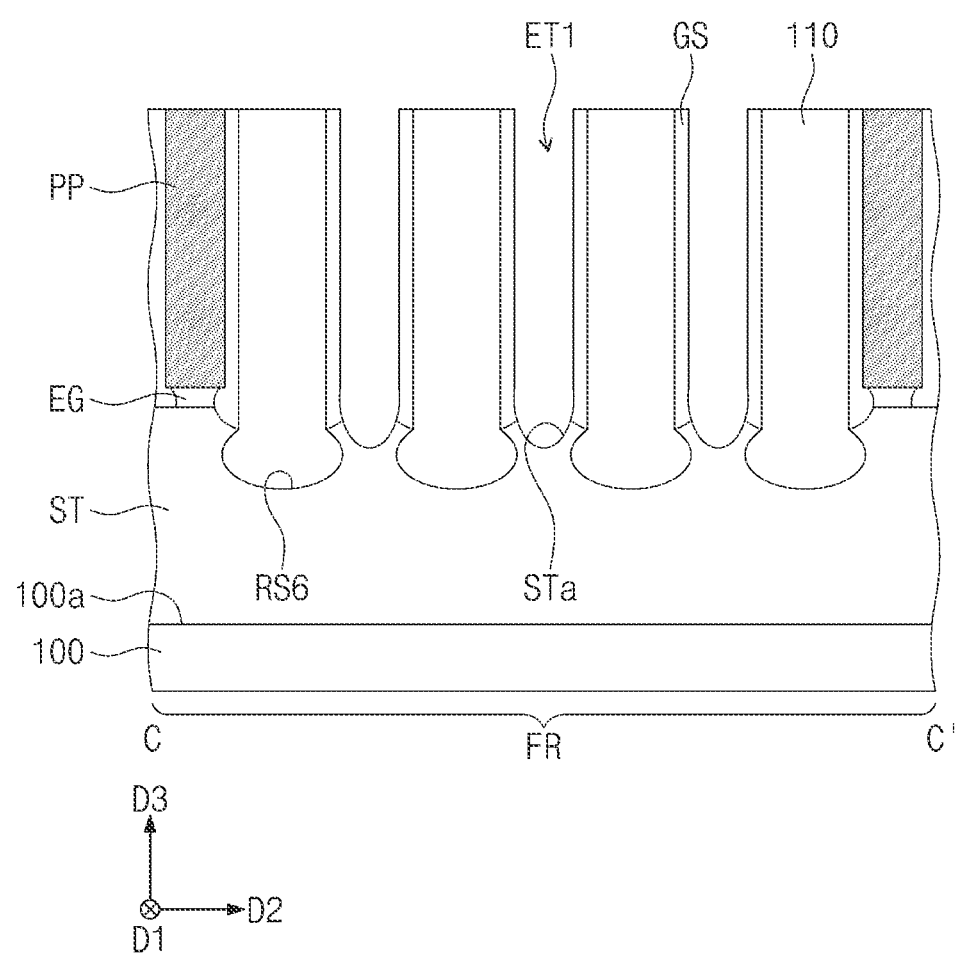
Figure 33:
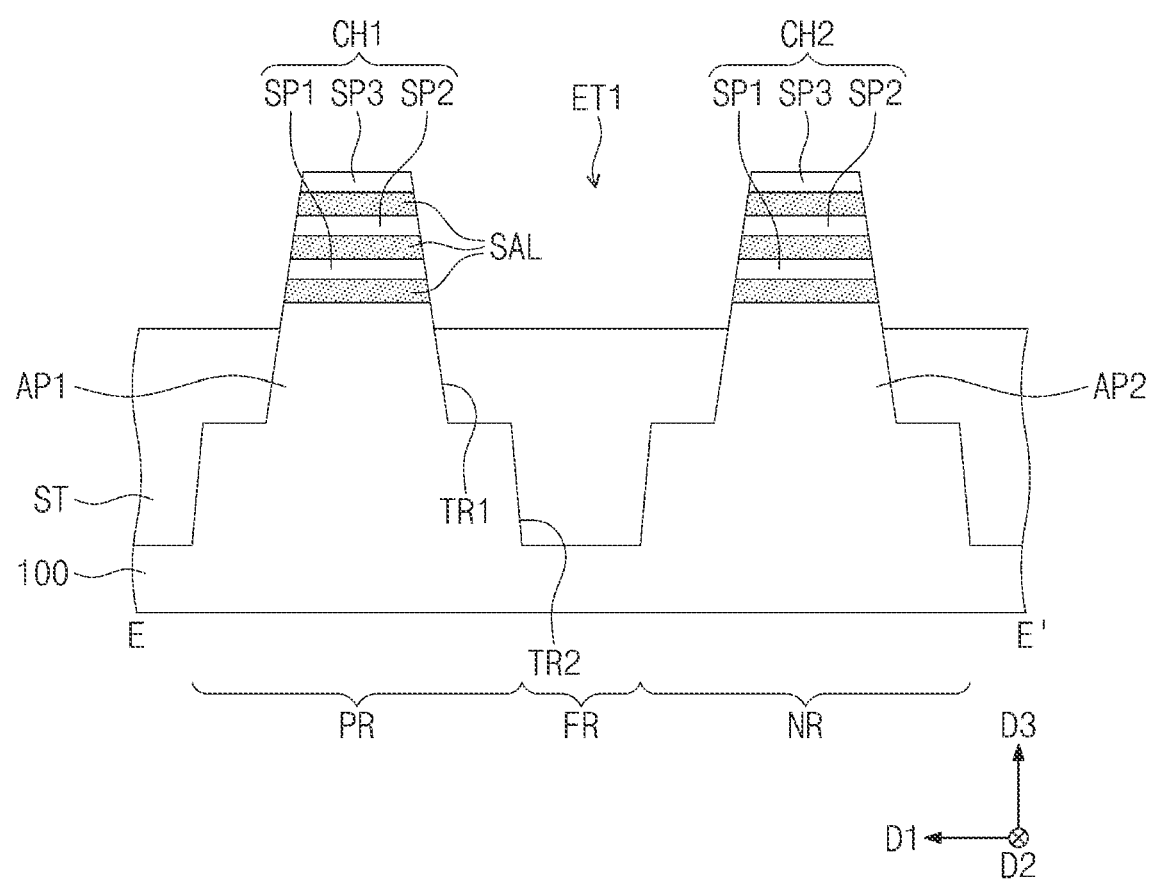
Figure 34:
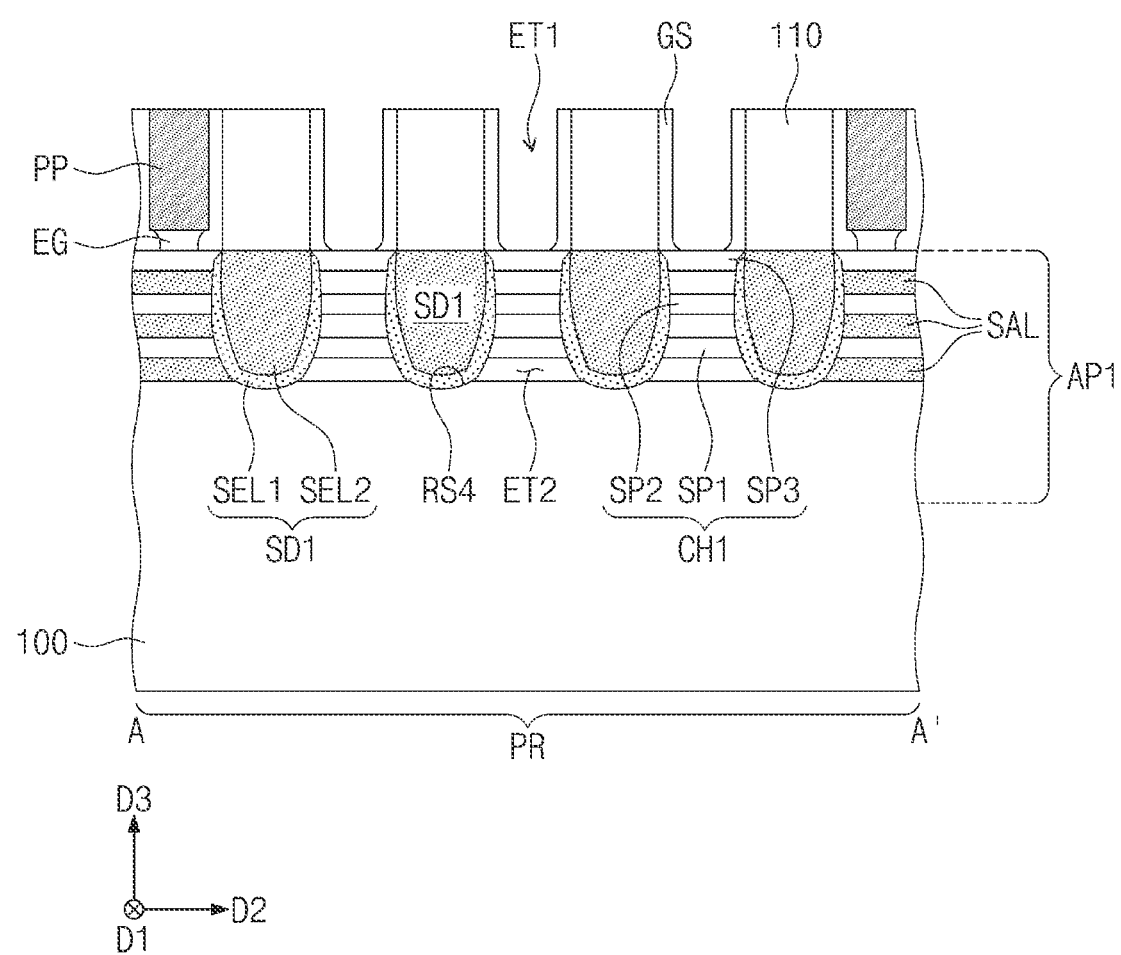
Figure 35:
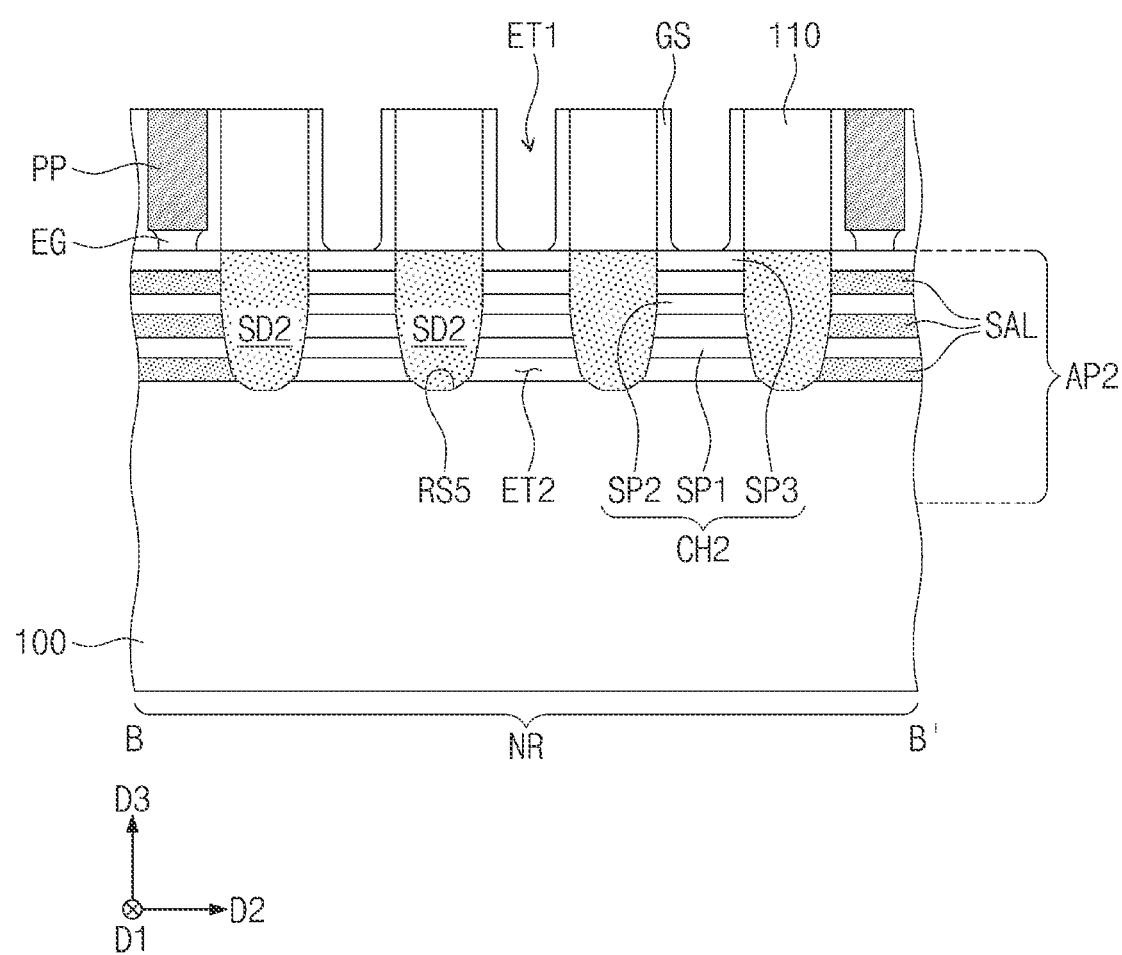
Figure 36:
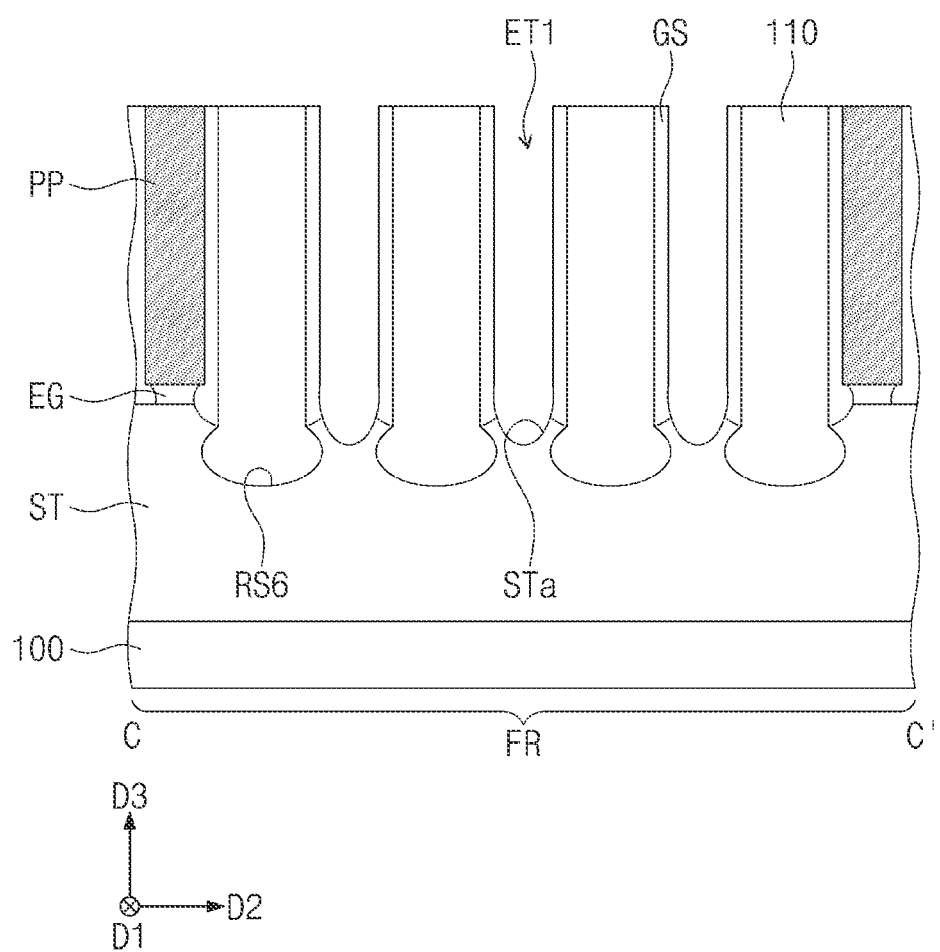
Figure 37:
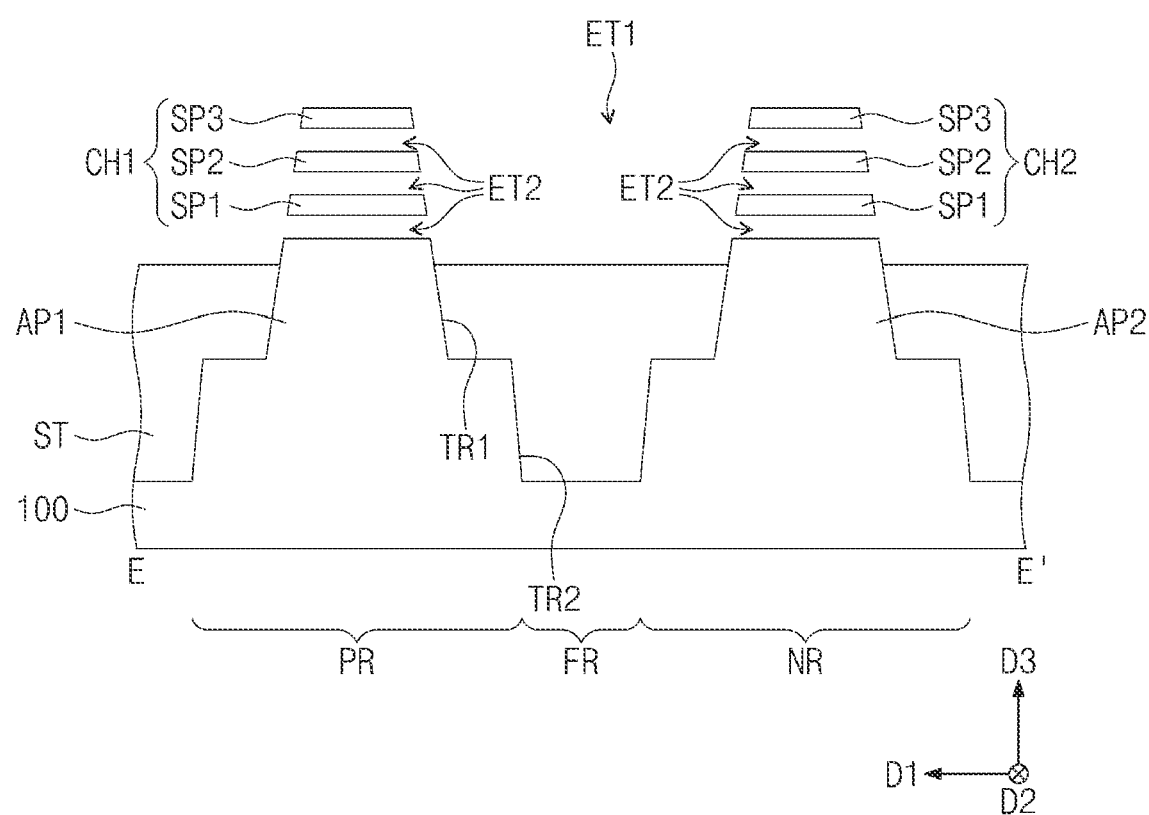
Figure 38:
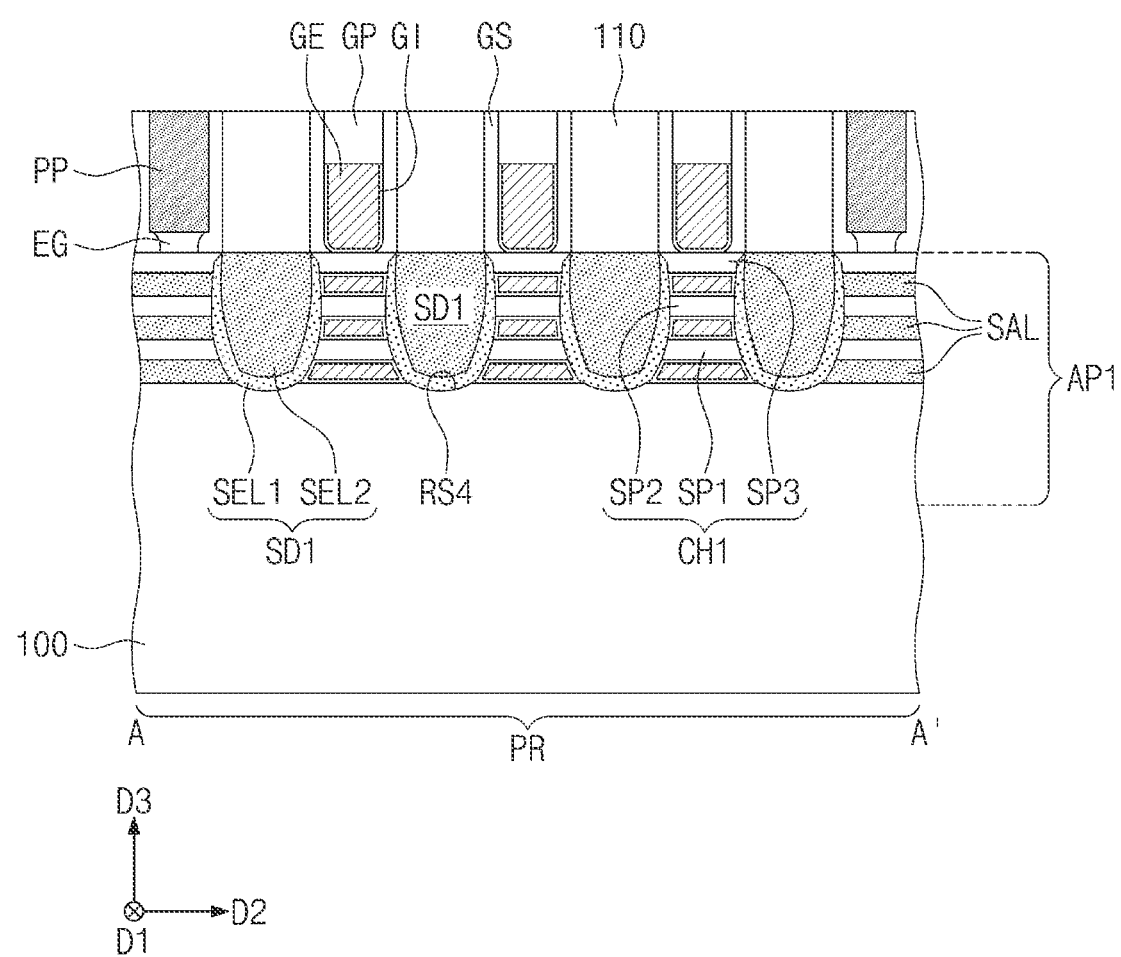
Figure 39:
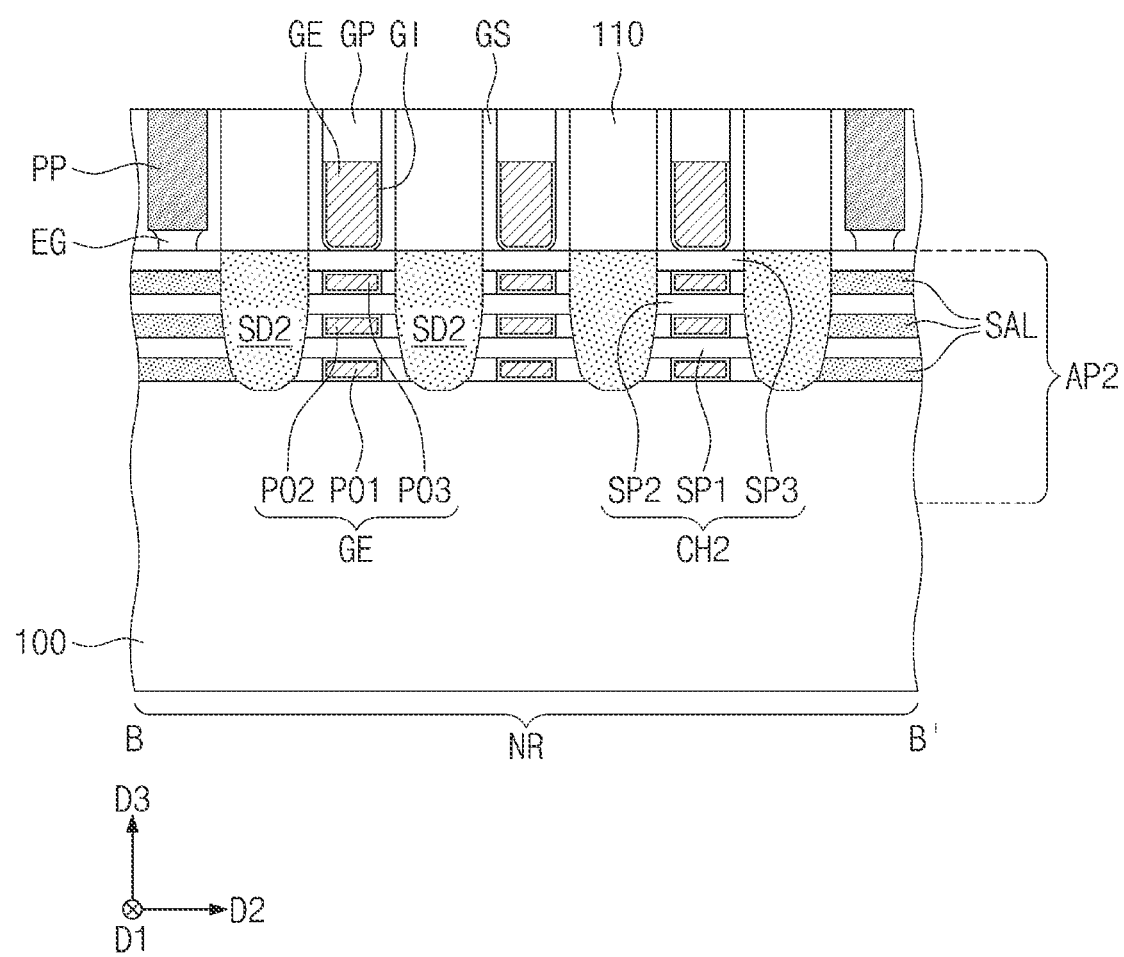
Figure 40:
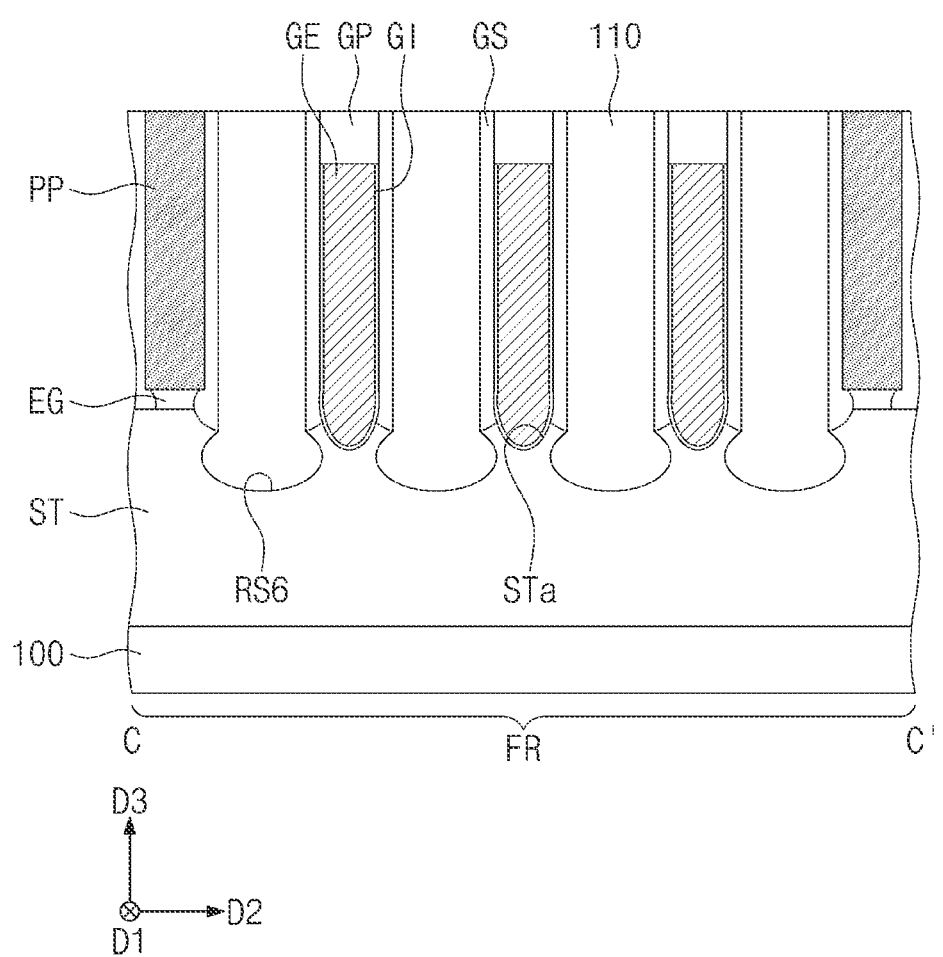
Figure 41:
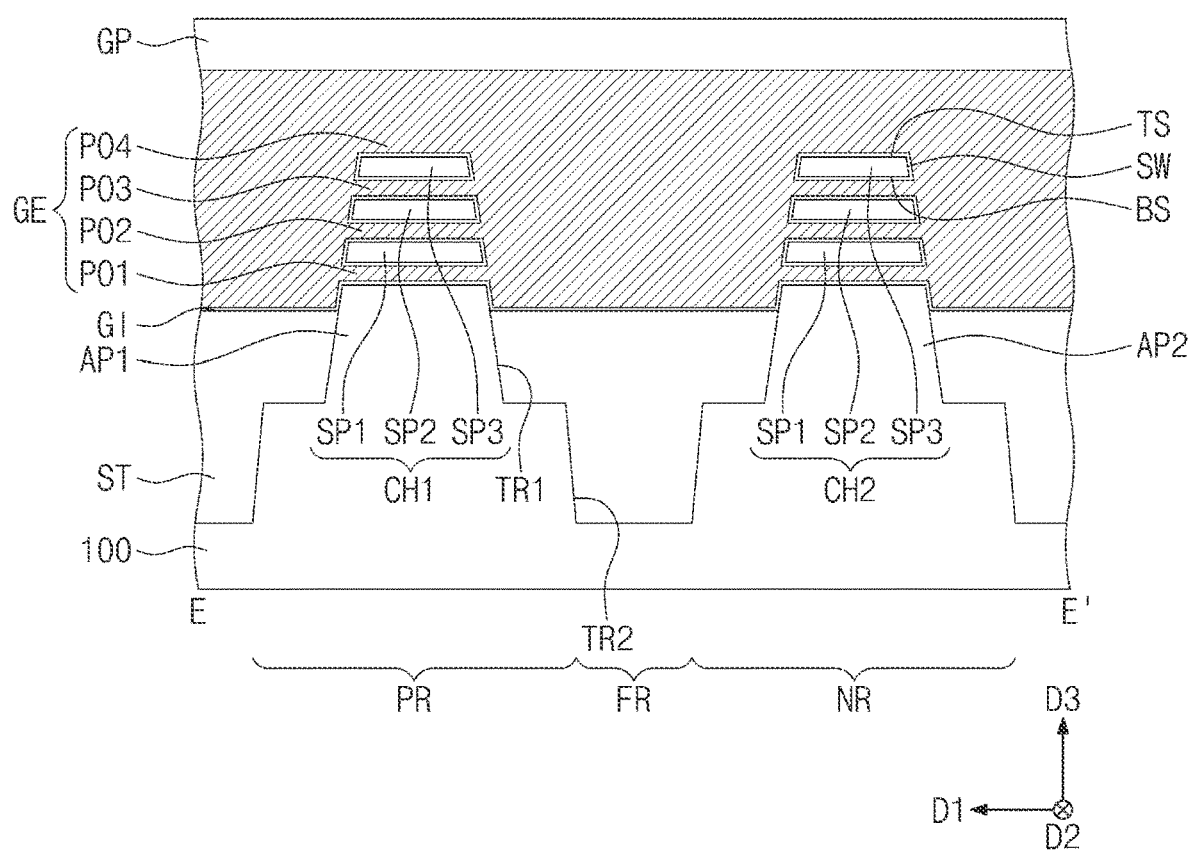

FIGS. 7 to 41 are cross-sectional views illustrating a method of fabricating a semiconductor device, according to an embodiment of the inventive concept. More specifically, FIGS. 7, 9, 12, 15, 20, 25, 30, 34, and 38 are cross-sectional views, which are taken along the line A-A' of FIG. 1 to illustrate the fabrication method according to an embodiment of the inventive concept. FIGS. 16, 21, 26, 31, 35, and 39 are cross-sectional views, which are taken along the line B-B' of FIG. 1 to illustrate the fabrication method according to an embodiment of the inventive concept. FIGS. 10, 13, 17, 22, 27, 32, 36, and 40 are cross-sectional views, which are taken along the line C-C' of FIG. 1 to illustrate the fabrication method according to an embodiment of the inventive concept. FIGS. 18, 23, and 28 are cross-sectional views, which are taken along the line D-D' of FIG. 1 to illustrate the fabrication method according to an embodiment of the inventive concept. FIGS. 8, 11, 14, 19, 24, 29, 33, 37, and 41 are cross-sectional views, which are taken along the line E-E' of FIG. 1 to illustrate the fabrication method according to an embodiment of the inventive concept.

Figure 7:
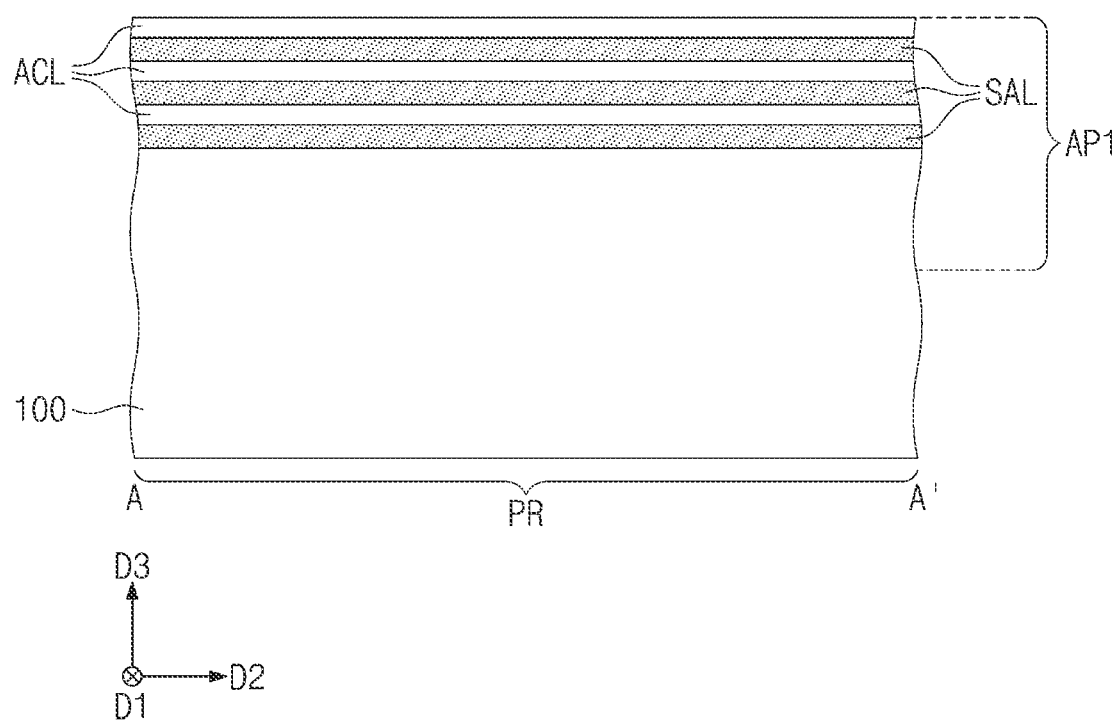
FIGS. 7 to 41 are cross-sectional views illustrating a method of fabricating a semiconductor device, according to an embodiment of the inventive concept.
Figure 8:
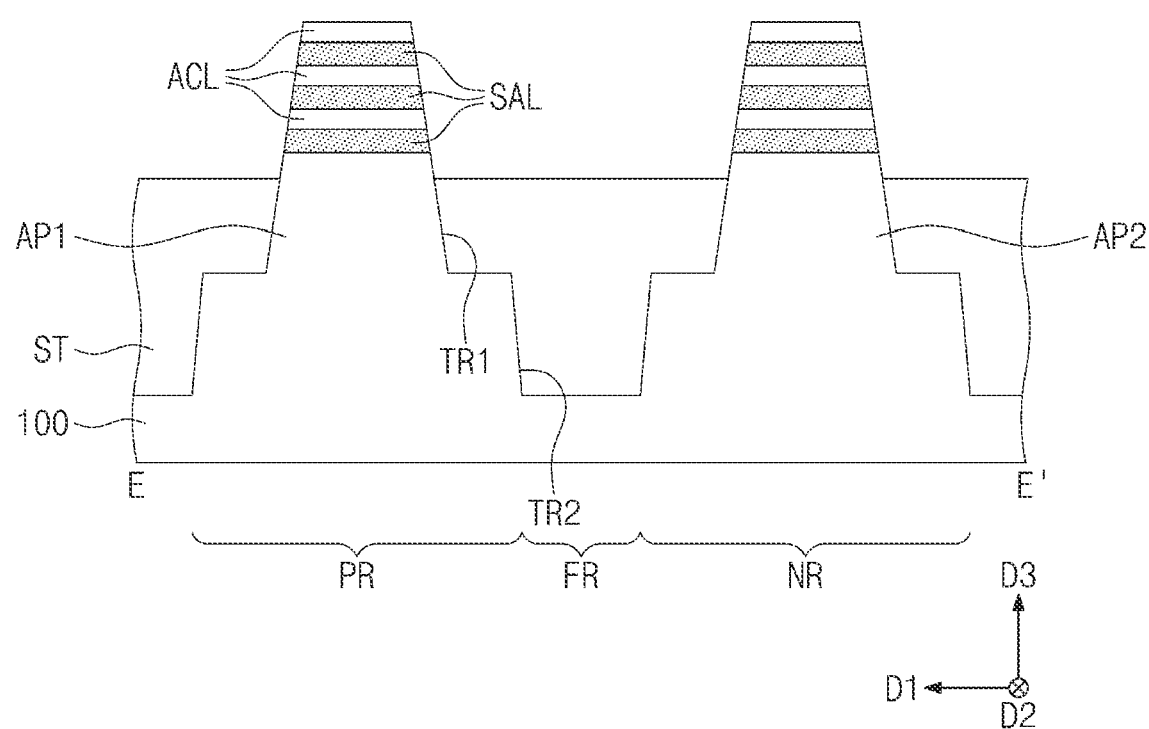

Referring to FIGS. 7 and 8, a substrate 100 including a PMOSFET region PR and an NMOSFET region NR may be provided. Sacrificial layers SAL and active layers ACL, which are alternately stacked on the substrate 100, may be formed. The sacrificial layers SAL may be formed of or include at least one of silicon (Si), germanium (Ge), or silicon-germanium (SiGe), and the active layers ACL may be formed of or include at least one of silicon (Si), germanium (Ge), or silicon-germanium (SiGe). For example, the sacrificial layers SAL may be formed of (or include) silicon-germanium (SiGe), and the active layers ACL may be formed of or include silicon (Si). A germanium concentration of each of the sacrificial layers SAL may range from 10 at % to 30 at %.

Mask patterns may be respectively formed on the PMOSFET region PR and the NMOSFET region NR of the substrate 100. The mask pattern may be a line- or bar-shaped pattern extending in a second direction D2. For example, the mask pattern may be formed of or include silicon nitride.

A first patterning process, in which the mask patterns are used as an etch mask, may be performed to form a first trench TR1 defining a first active pattern AP1 and a second active pattern AP2. The first active pattern AP1 and the second active pattern AP2 may be formed on the PMOSFET region PR and the NMOSFET region NR, respectively. Each of the first and second active patterns AP1 and AP2 may include the sacrificial layers SAL and the active layers ACL, which are alternately stacked in an upper portion thereof.

A second patterning process may be performed on the substrate 100 to form a second trench TR2 defining the PMOSFET region PR and the NMOSFET region NR. The second trench TR2 may be formed to be deeper than the first trench TR1.

A device isolation layer ST may be formed on the substrate 100 to fill the first and second trenches TR1 and TR2. For example, an insulating layer may be formed on the substrate 100 to cover the first and second active patterns AP1 and AP2. The device isolation layer ST may be formed by recessing the insulating layer until the sacrificial layers SAL are exposed.

The device isolation layer ST may be formed of or include an insulating material (e.g., silicon oxide). Each of the first and second active patterns AP1 and AP2 may include an upper portion protruding above the device isolation layer ST. For example, the upper portion of each of the first and second active patterns AP1 and AP2 may vertically protrude above the device isolation layer ST.

Figure 9:
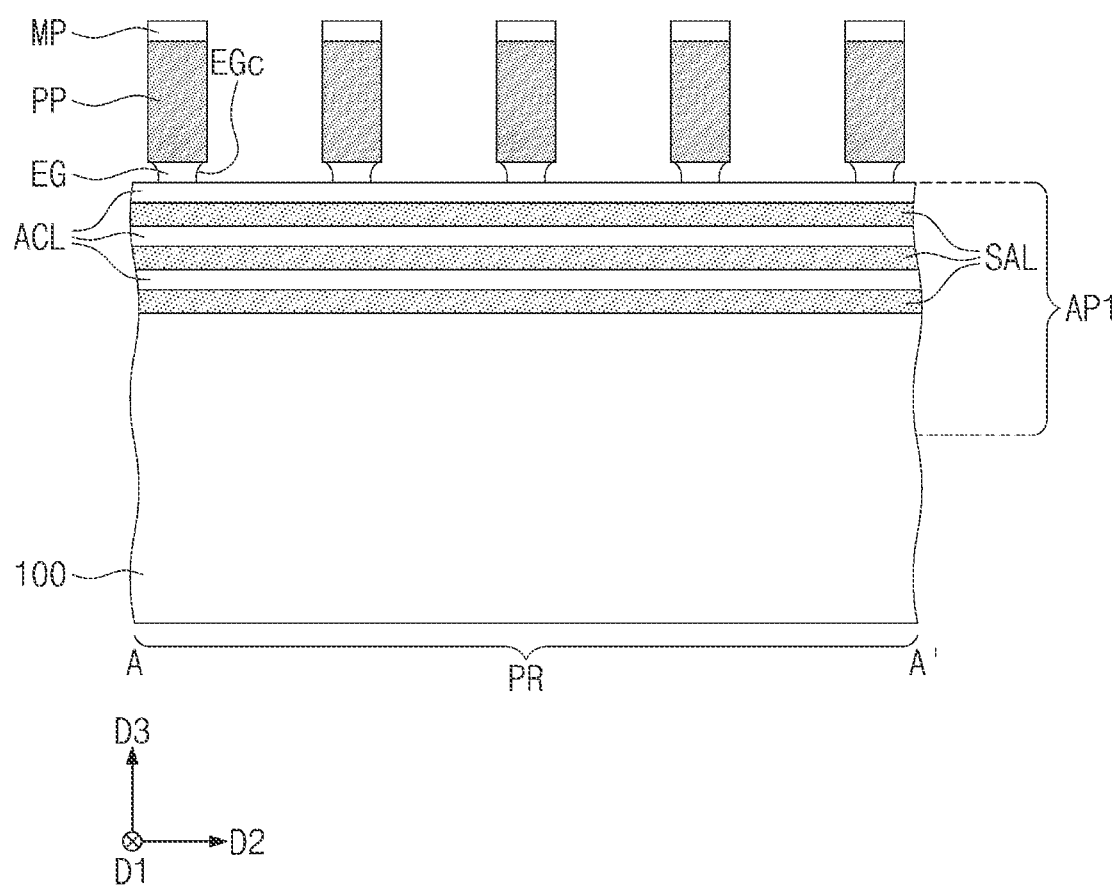
Figure 10:
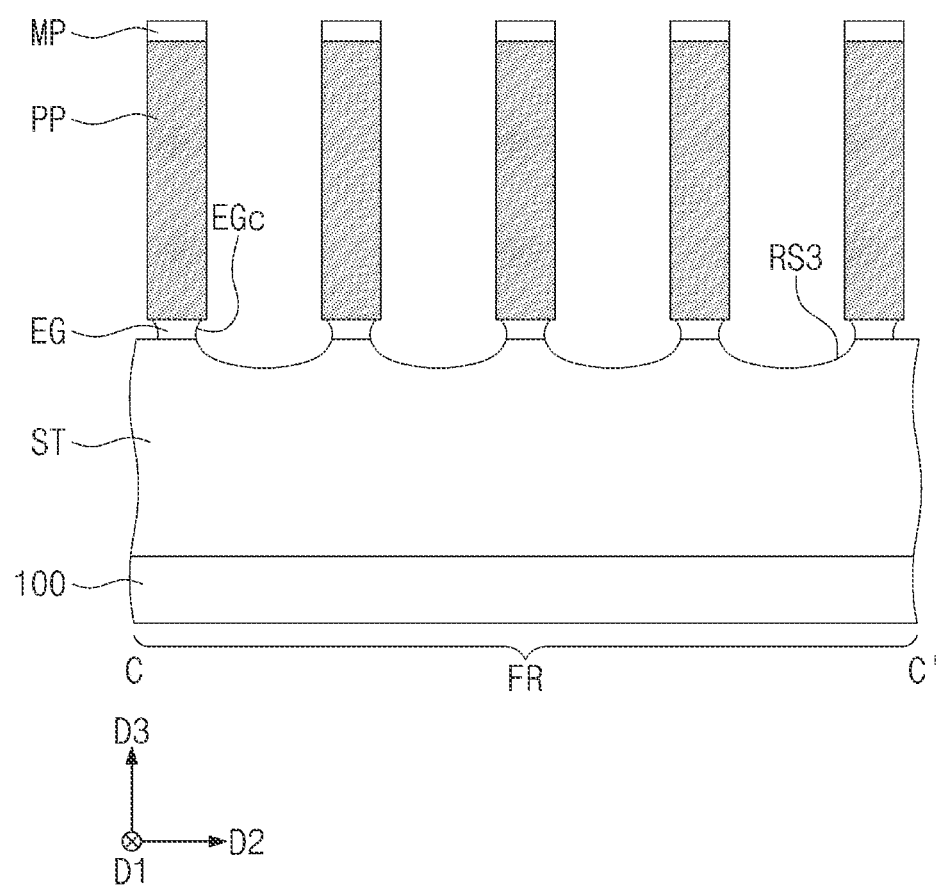
Figure 11:
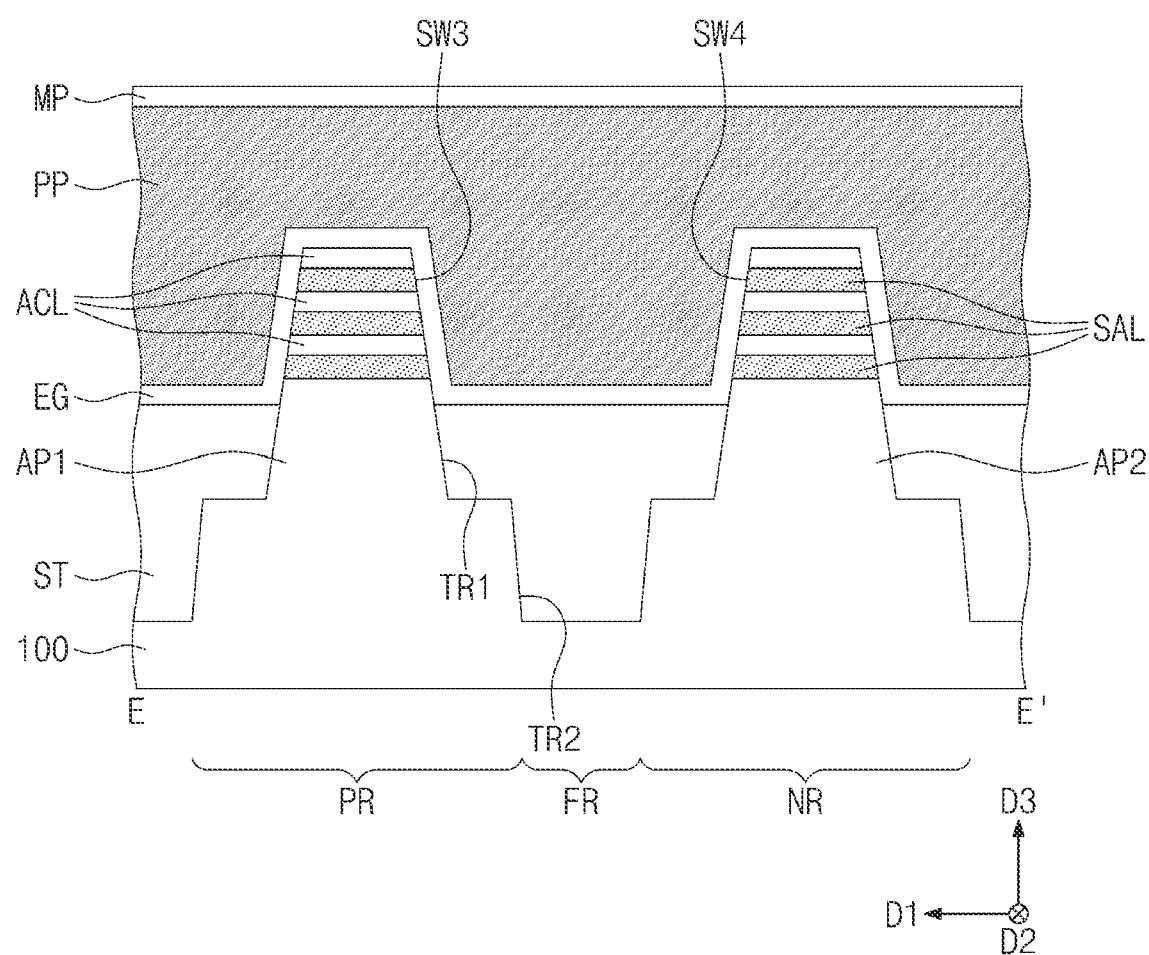

Referring to FIGS. 9, 10, and 11, first sacrificial patterns EG and second sacrificial patterns PP may be formed on the substrate 100 to cross the first and second active patterns AP1 and AP2. Each of the first and second sacrificial patterns EG and PP may be a line- or bar-shaped pattern extending in the first direction D1. The first and second sacrificial patterns EG and PP may be arranged with a specific pitch in the second direction D2.

In detail, the formation of the first and second sacrificial patterns EG and PP may include forming a first sacrificial layer on the substrate 100, forming a second sacrificial layer on the first sacrificial layer, forming hard mask patterns MP on the second sacrificial layer, and patterning the first and second sacrificial layers using the hard mask patterns MP as an etch mask. The first sacrificial layer may be formed of or include silicon oxide or nitrogen-doped silicon oxide, and the second sacrificial layer may be formed of or include poly silicon. The first sacrificial patterns EG may be interposed between the second sacrificial patterns PP and the first active pattern AP1 and between the second sacrificial patterns PP and the second active pattern AP2. Each of the first and second active patterns AP1 and AP2 may have a first sidewall SW3 and a second sidewall SW4, which are opposite to each other. The first sacrificial patterns EG may be formed to cover both of the first and second sidewalls SW3 and SW4 (e.g., see FIG. 11).

An etching process may be performed on the substrate 100 to form third recesses RS3 on the device isolation layer ST. More specifically, the formation of the third recesses RS3 may include performing the etching process to remove an upper portion of the device isolation layer ST and side portions of the first sacrificial patterns EG. For example, the etching process may be a dry etching process. The third recesses RS3 may have bottom surfaces that are convex toward a top surface of the substrate 100, and side surfaces EGc of the first sacrificial patterns EG may be recessed by the etching process and thus may have a curved surface profile. After the etching process, each of the first sacrificial patterns EG may have a width that is smaller than a width of each of the second sacrificial patterns PP.

Figure 12:
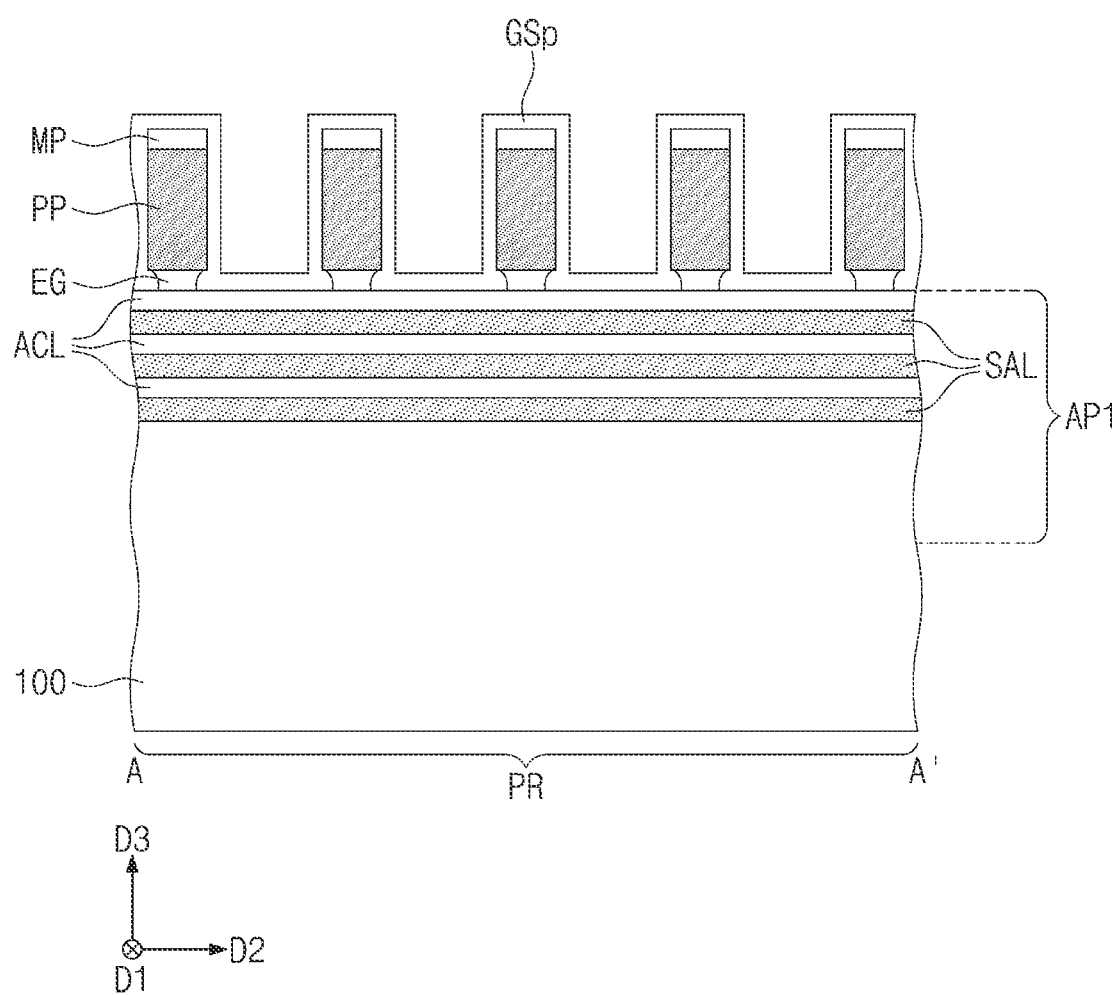
Figure 13:
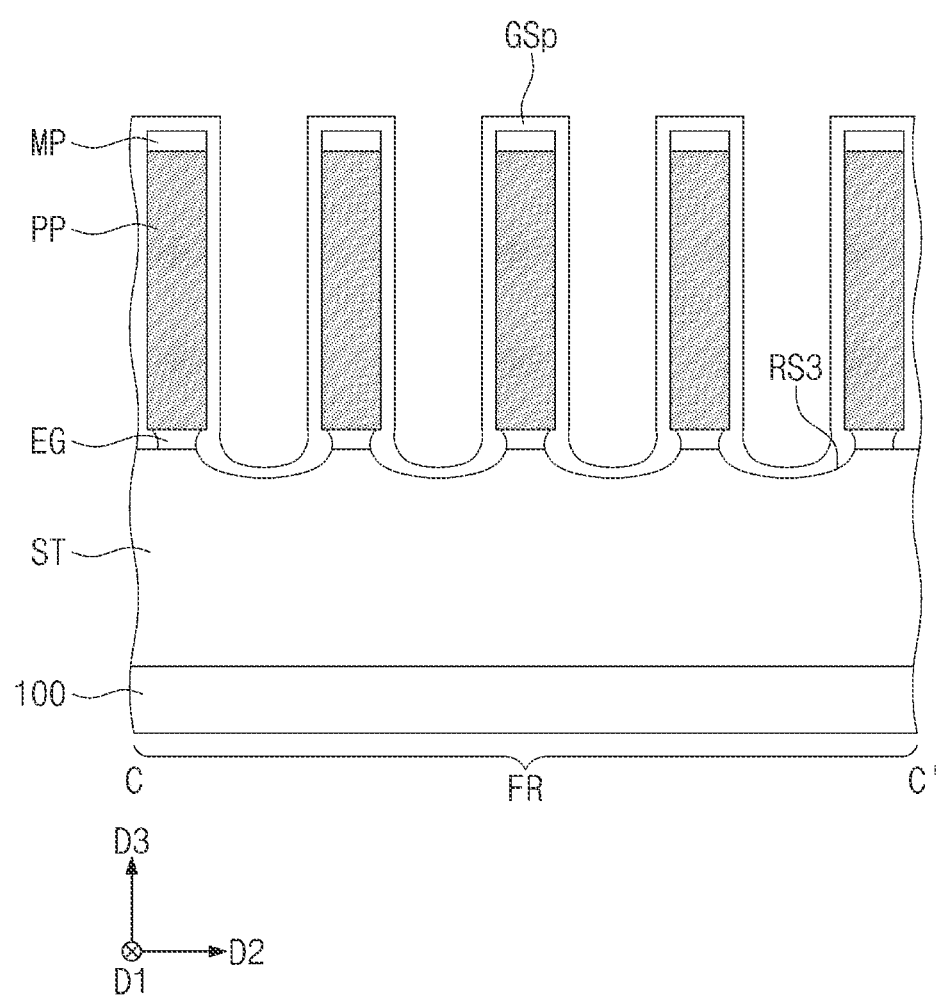
Figure 14:
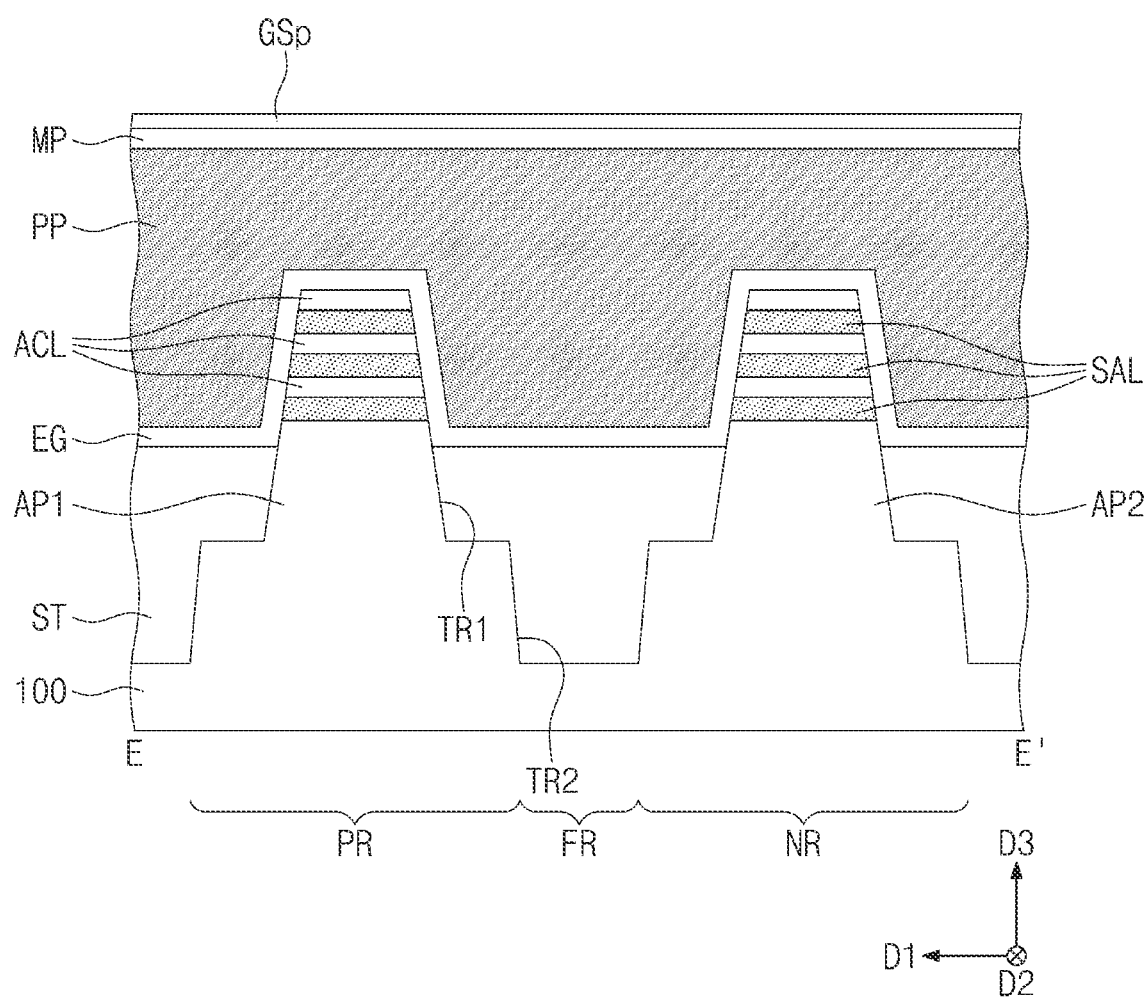
Figure 15:
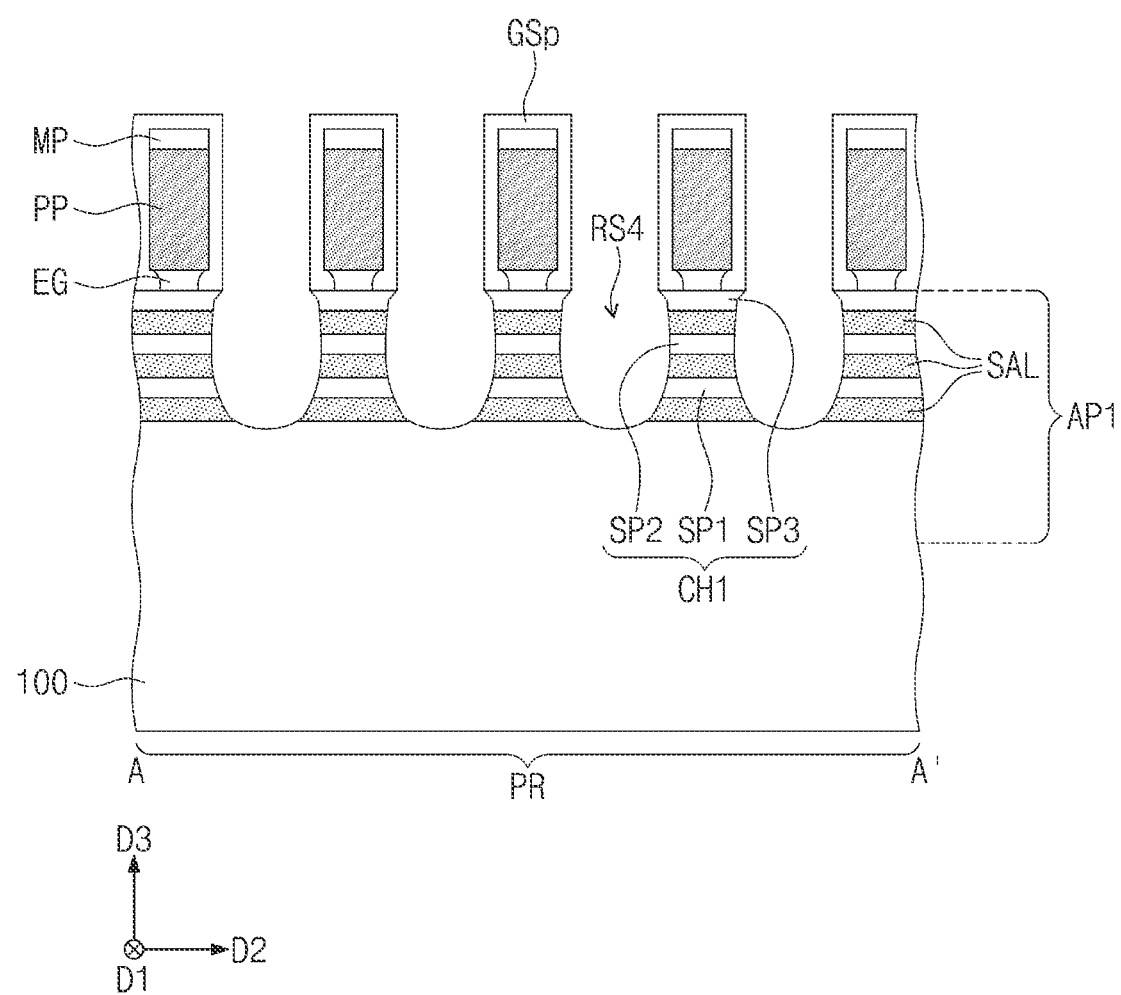
Figure 16:
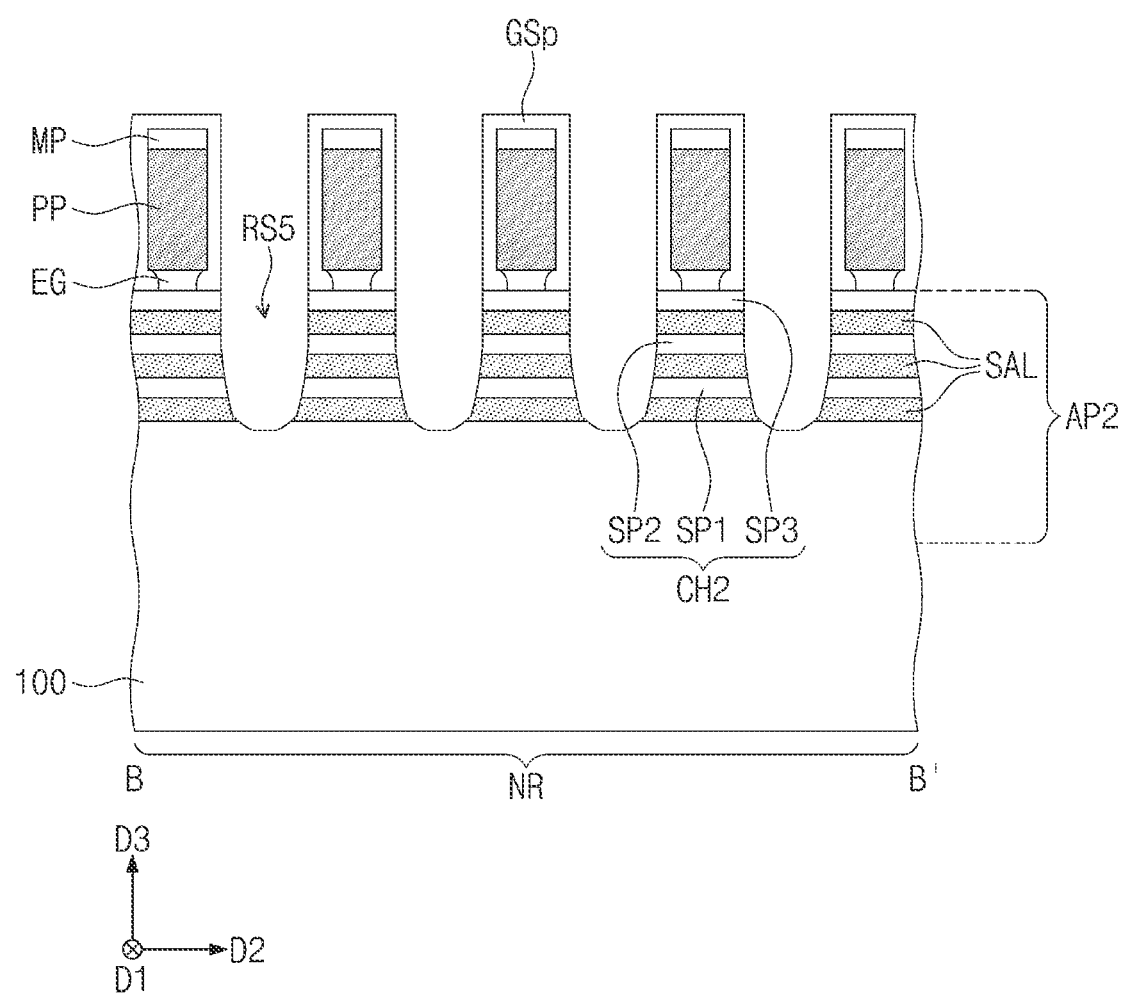
Figure 17:
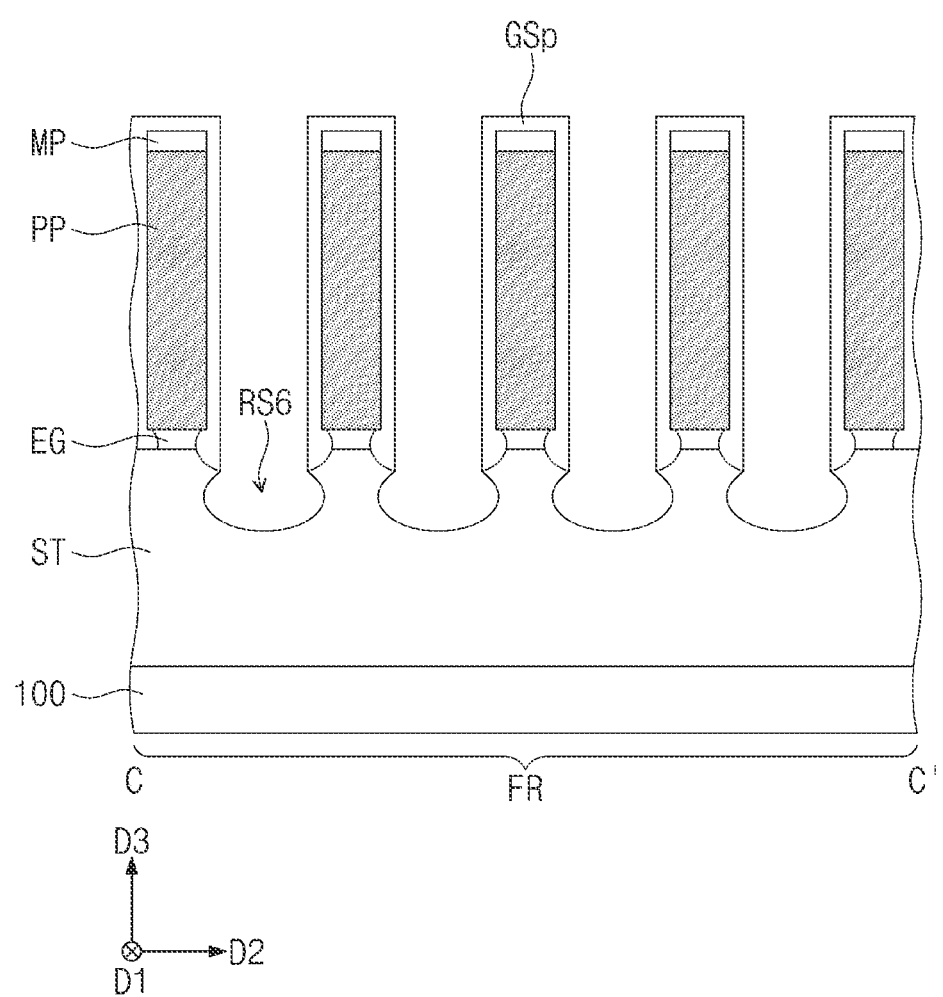

Referring to FIGS. 12, 13, and 14, a gate spacer layer GSp may be formed to cover the entire top surface of the substrate 100. The gate spacer layer GSp may conformally cover the mask pattern MP, the first sacrificial patterns EG, and the second sacrificial patterns PP. More specifically, the gate spacer layer GSp may conformally cover the top and side surfaces of the mask pattern MP, the side surfaces of the second sacrificial patterns PP, and the side surfaces of the first sacrificial patterns EG. In the field region FR, the gate spacer layer GSp may conformally cover inner surfaces of the third recesses RS3. The gate spacer layer GSp may be formed of or include at least one of SiCN, SiCON, or SiN. In an embodiment, the gate spacer layer GSp may be a multi-layered structure including at least two of SiCN, SiCON, or SiN.

Referring to FIGS. 15, 16, 17, 18, and 19, fourth recesses RS4 may be formed in an upper portion of the first active pattern AP1. Fifth recesses RS5 may be formed in an upper portion of the second active pattern AP2. A portion of the gate spacer layer GSp may be removed during the formation of the fourth and fifth recesses RS4 and RS5. Sixth recesses RS6 may be formed by recessing portions of the device isolation layer ST, which are located at both sides of each of the first and second active patterns AP1 and AP2, during the formation of the fourth and fifth recesses RS4 and RS5 (e.g., see FIG. 17). The fourth recesses RS4 and the fifth recesses RS5 may be formed between a pair of the sacrificial patterns PP.

Referring to FIGS. 20, 21, 22, 23, and 24, first source/drain patterns SD1 may be formed in the fourth recesses RS4, respectively. Specifically, a first SEG process, in which an inner surface of the fourth recess RS4 is used as a seed layer, may be performed to form a first semiconductor layer SEL1. The first semiconductor layer SEL1 may be grown using first to third semiconductor patterns SP1, SP2, and SP3 and the substrate 100, which are exposed through the fourth recesses RS4, as a seed. As an example, the first SEG process may include a chemical vapor deposition (CVD) process or a molecular beam epitaxy (MBE) process.

The first semiconductor layer SEL1 may be formed of or include a semiconductor material (e.g., SiGe) having a lattice constant greater than that of the substrate 100. The first semiconductor layer SEL1 may be formed to have a relatively low germanium concentration. In another embodiment, the first semiconductor layer SEL1 may be provided to contain only silicon (Si) and not germanium (Ge). The germanium concentration of the first semiconductor layer SEL1 may range from 0 at % to 10 at %.

A second semiconductor layer SEL2 may be formed by performing a second SEG process on the first semiconductor layer SEL1. The second semiconductor layer SEL2 may be formed to completely fill the first recess RS1. The second semiconductor layer SEL2 may be provided to have a relatively high germanium concentration. As an example, the germanium concentration of the second semiconductor layer SEL2 may range from 30 at % to 70 at %.

The first and second semiconductor layers SEL1 and SEL2 may constitute the first source/drain pattern SD1. The first and second semiconductor layers SEL1 and SEL2 may be doped with impurities in situ during the first and second SEG processes. Alternatively, the first source/drain pattern SD1 may be doped with impurities, after the formation of the first source/drain pattern SD1. The first source/drain pattern SD1 may be doped to have a first conductivity type (e.g., p-type).

The second source/drain patterns SD2 may be formed in the fifth recesses RS5, respectively. Specifically, the second source/drain pattern SD2 may be formed by a SEG process using an inner surface of the fifth recess RS5 as a seed layer. As an example, the second source/drain patterns SD2 may be formed of or include the same semiconductor material (e.g., Si) as the substrate 100. The second source/drain patterns SD2 may be doped to have a second conductivity type (e.g., n-type).

Referring to FIGS. 25, 26, 27, 28 and 29, the first interlayer insulating layer 110 may be formed to cover the first and second source/drain patterns SD1 and SD2, the hard mask patterns MP, and the gate spacer layer GSp. As an example, the first interlayer insulating layer 110 may be formed of or include silicon oxide. In the field region FR, the first interlayer insulating layer 110 may be formed to fill the sixth recess RS6. Accordingly, in the field region FR, a lower portion of the first interlayer insulating layer 110 may have a shape that is convex toward the top surface of the substrate 100.

The gate spacers GS may be formed by planarizing the first interlayer insulating layer 110 to expose the top surfaces of the second sacrificial patterns PP. The planarization of the first interlayered insulating layer 110 may be performed using an etch-back or chemical mechanical polishing (CMP)

process. All of the hard mask patterns MP may be removed during the planarization process. As a result, a top surface of the first interlayer insulating layer 110 may be coplanar with the top surfaces of the sacrificial patterns PP and the top surfaces of the gate spacers GS.

The exposed second sacrificial patterns PP may be selectively removed by an etching process. Some of the second sacrificial patterns PP may be removed to form first empty spaces ET1 exposing the first sacrificial patterns EG (e.g., see FIG. 25). The etching process may be, for example, a wet etching process. However, other ones of the second sacrificial patterns PP may not be removed. For example, the second sacrificial patterns PP, which are located at a cell boundary, may not be removed. In detail, by forming a mask layer may be formed on the second sacrificial patterns PP, which should not be removed, it may be possible to prevent the second sacrificial patterns PP from being unintentionally removed. As a result of the selective removal of the second sacrificial patterns PP, the first sacrificial patterns EG may be exposed through the first empty space ET1.

Referring to FIGS. 30, 31, 32, and 33, the first sacrificial patterns EG, which are exposed through the first empty space ET1, may be removed by an etching process. As a result of the removal of the first sacrificial patterns EG, the first and second active patterns AP1 and AP2 may be exposed through the first empty spaces ET1 (e.g., see FIG. 33). More specifically, the sacrificial layers SAL of each of the first and second active patterns AP1 and AP2 may be exposed through the first empty spaces ET1. The etching process may be, for example, a dry etching process. In the first and second active regions PR and NR, the inner sidewalls of the gate spacers GS and the lower portions of the gate spacers GS adjacent to the first sacrificial patterns EG may also be partially removed during the removal of the first sacrificial patterns EG. Accordingly, the inner sidewalls of the gate spacers GS, which are exposed through the first empty spaces ET1, may have a curved surface profile. For example, a width of each of the gate spacers GS may increase with decreasing distance from the substrate 100. In the field region FR, the inner sidewalls of the gate spacers GS, the lower portions of the gate spacers GS adjacent to the first sacrificial patterns EG, and an upper portion of the device isolation layer ST may also be partially removed during the removal of the first sacrificial patterns EG. More specifically, since the device isolation layer ST includes the same material as the first sacrificial patterns EG, the device isolation layer ST may be etched during the process of removing the first sacrificial patterns EG. Accordingly, a top surface STa of the device isolation layer ST, which is exposed through the first empty space ET1 in the field region FR, may be convex toward the top surface 100a of the substrate 100.

Referring to FIGS. 34, 35, 36, and 37, the sacrificial layers SAL exposed through the first empty space ET1 may be selectively removed. In detail, an etching process may be performed to selectively etch only the sacrificial layers SAL and to leave the first to third semiconductor patterns SP1, SP2, and SP3. In some embodiments, the etching process may be chosen to exhibit a high etch rate for a material (e.g., SiGe) having a relatively high germanium concentration. For example, the etching process may have a high etch rate for silicon-germanium whose germanium concentration is higher than 10 at %.

Referring back to FIG. 37, since the sacrificial layers SAL are selectively removed, only the first to third semiconductor patterns SP1, SP2, and SP3 may be left on each of the first and second active patterns AP1 and AP2. Accordingly, second empty spaces ET2 may be formed as a result of the removal of the sacrificial layers SAL. The second empty spaces ET2 may be formed between the first to third semiconductor patterns SP1, SP2, and SP3.

Referring to FIGS. 38, 39, 40 and 41, the gate insulating layer GI may be conformally formed in the first and second empty spaces ET1 and ET2. The gate electrode GE may be formed on the gate insulating layer GI. The gate electrode GE may be formed to fill the first and second empty spaces ET1 and ET2. Specifically, the gate electrode GE may include the first to third portions PO1, PO2, and PO3 filling the second empty spaces ET2. The gate electrode GE may further include the fourth portion PO4 filling the first empty space ET1. The gate capping pattern GP may be formed on the gate electrode GE.

In an embodiment, the insulating patterns IP may be first formed on the second active region NR, before the formation of the gate insulating layer GI. The insulating pattern IP may be formed to partially fill the second empty space ET2. In this case, the gate electrode GE on the NMOSFET region NR may be spaced apart from the second source/drain pattern SD2 with the insulating pattern IP interposed therebetween.

Referring back to FIGS. 1, 2A, 3, 4A, 5, and 6, the second interlayer insulating layer 120 may be formed on the first interlayer insulating layer 110. The second interlayer insulating layer 120 may include a silicon oxide layer. The active contacts AC may be formed to penetrate the second interlayer insulating layer 120 and the first interlayer insulating layer 110 and to be electrically connected to the first and second source/drain patterns SD1 and SD2. The gate contact GC may be formed to penetrate the second interlayer insulating layer 120 and the gate capping pattern GP and to be electrically connected to the gate electrode GE.

A pair of dividing structures DB may be formed at both sides of the logic cell LC. In an embodiment, the dividing structure DB may be formed to penetrate the second interlayer insulating layer 120, the remaining portion of the second sacrificial pattern PP, and an upper portion of the active pattern AP1 or AP2 below the second sacrificial pattern PP. The dividing structure DB may be formed of or include at least one of insulating materials (e.g., silicon oxide or silicon nitride).

The third interlayer insulating layer 130 may be formed on the active contacts AC and the gate contacts GC. The first metal layer M1 may be formed in the third interlayer insulating layer 130. The fourth interlayer insulating layer 140 may be formed on the third interlayer insulating layer 130. The second metal layer M2 may be formed in the fourth interlayer insulating layer 140. The semiconductor device according to an embodiment of the inventive concept may be fabricated by the afore-described method.

According to an embodiment of the inventive concept, a semiconductor device may include a gate spacer including a first portion, which is extended parallel to a side surface of a gate electrode, and a second portion, which protrudes toward the gate electrode. A distance between the gate electrode and a source/drain pattern adjacent thereto may be increased, due to the presence of the second portion. Accordingly, it may be possible to improve an electrical insulating property between the gate electrode and the source/drain pattern.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:
a substrate including a first active region, a second active region, and a field region between the first and second active regions;
a first active pattern on the first active region and a second active pattern on the second active region;
first source/drain patterns on the first active pattern and second source/drain patterns on the second active pattern;
a first channel pattern between the first source/drain patterns and a second channel pattern between the second source/drain patterns, each of the first and second channel patterns comprising semiconductor patterns, which are stacked to be spaced apart from each other;
a gate electrode extended from the first channel pattern to the second channel pattern to cross the field region; and
a gate spacer extending on a side surface of the gate electrode, and crossing the first and second active regions and the field region;
wherein, on the field region, a lowermost portion of the gate electrode is provided at a level lower than a lowermost portion of the gate spacer; and
wherein a width of a lower portion of the gate electrode on the field region decreases with decreasing distance from a top surface of the substrate.

2. The semiconductor device of claim 1, wherein a bottom surface of the gate spacer on the field region is inclined at an angle to the top surface of the substrate.

3. The semiconductor device of claim 2, wherein a level of the bottom surface of the gate spacer on the field region is elevated with decreasing distance from the gate electrode.

4. The semiconductor device of claim 1, wherein the gate spacer on the field region comprises:
a first portion, which has a constant width and is vertically extended; and
a second portion, which is connected to the first portion and is positioned adjacent to the lower portion of the gate electrode,
wherein, with decreasing distance from the top surface of the substrate, a width of the second portion is increased until it reaches its largest width, and then is decreased.

5. The semiconductor device of claim 1, wherein, on the field region, a height of the gate electrode ranges from 50 nm to 100 nm.

6. The semiconductor device of claim 1, wherein on the first and second active regions of the substrate, a width of the gate spacer increases with decreasing distance from the top surface of the substrate.

7. The semiconductor device of claim 1, further comprising:
a gate insulating layer interposed between the gate spacer and the gate electrode,
wherein on the first and second active regions, the gate spacer comprises a first portion, which is vertically extended, and a second portion, which protrudes toward the gate electrode, and
the second portion is extended toward a contact surface between the gate insulating layer and the uppermost one of the semiconductor patterns and is vertically overlapped with the gate insulating layer.

8. The semiconductor device of claim 7, wherein a height of the second portion of the gate spacer decreases with decreasing distance from the gate electrode.

9. The semiconductor device of claim 7, wherein the largest width of the second portion of the gate spacer ranges from 1 nm to 5 nm.

10. The semiconductor device of claim 1, wherein the gate electrode comprises:
a first portion provided on the semiconductor patterns; and
a second portion provided between the semiconductor patterns and between the semiconductor patterns and the substrate,
wherein a width of the first portion of the gate electrode decreases with decreasing distance from the semiconductor patterns.

11. A semiconductor device, comprising:
a substrate including a first active region, a second active region, and a field region between the first and second active regions, the first and second active regions being adjacent to each other in a first direction;
first and second active patterns provided on the first and second active regions, respectively;
a pair of first source/drain patterns on the first active pattern and a pair of second source/drain patterns on the second active pattern;
a first channel pattern interposed between the pair of first source/drain patterns and a second channel pattern interposed between the pair of second source/drain patterns, each of the first and second channel patterns comprising a first semiconductor pattern, a second semiconductor pattern, and a third semiconductor pattern, which are sequentially stacked to be spaced apart from each other;
a gate electrode extended from the first channel pattern to the second channel pattern in the first direction to cross the field region;
a first gate insulating layer and a second gate insulating layer respectively interposed between the first channel pattern and the gate electrode and between the second channel pattern and the gate electrode;
a gate spacer provided on a side surface of the gate electrode;
a gate capping pattern provided on a top surface of the gate electrode;
a first interlayer insulating layer on the gate capping pattern;
an active contact provided to penetrate the first interlayer insulating layer and coupled to at least one of the first and second source/drain patterns;
a gate contact provided to penetrate the first interlayer insulating layer and coupled to the gate electrode;
a second interlayer insulating layer on the first interlayer insulating layer;
a first metal layer provided in the second interlayer insulating layer, the first metal layer comprising first interconnection lines, which are electrically connected to the active contact and the gate contact;
a third interlayer insulating layer on the second interlayer insulating layer; and
a second metal layer provided in the third interlayer insulating layer,
wherein the second metal layer comprises second interconnection lines, which are electrically connected to the first interconnection lines,
wherein, on each of the first and second active regions, the gate electrode comprises a first portion interposed between the substrate and the first semiconductor pattern, a second portion interposed between the first semiconductor pattern and the second semiconductor pattern, a third portion interposed between the second semiconductor pattern and the third semiconductor pattern, and a fourth portion on the third semiconductor pattern, and wherein, on the field region, a width of a lower portion of the gate electrode decreases with decreasing distance from a top surface of the substrate and a bottom surface of the gate spacer is inclined at an angle to the top surface of the substrate.

12. The semiconductor device of claim 11, wherein, on the field region, the gate spacer comprises:

a first portion, which has a constant width and is vertically extended; and a second portion, which is connected to the first portion and is located adjacent to the lower portion of the gate electrode, wherein, with decreasing distance from the top surface of the substrate, a width of the second portion is increased until it reaches its largest width, and then is decreased.

13. The semiconductor device of claim 11, wherein on the field region, the lowermost portion of the gate electrode is provided at a level lower than the lowermost portion of the gate spacer.

14. A semiconductor device, comprising:

a substrate including a first active region, a second active region, and a field region extending between the first and second active regions;

first and second active patterns on the first and second active regions, respectively;

first source/drain patterns on the first active pattern;

second source/drain patterns on the second active pattern;

a first channel pattern extending between the first source/drain patterns and a second channel pattern extending between the second source/drain patterns, with each of the first and second channel patterns comprising a corresponding plurality of semiconductor patterns that are stacked to be spaced apart from each other;

a gate electrode extending from the first channel pattern to the second channel pattern to cross the field region; and a gate spacer extending on a side surface of the gate electrode and crossing the first and second active regions and the field region; and wherein on the field region, a lowermost portion of the gate electrode is provided at a level lower than a lowermost portion of the gate spacer.

15. The device of claim 14, wherein, on the field region, a height of the gate electrode ranges from 50 nm to 100 nm.

16. The device of claim 14, wherein a bottom surface of the gate spacer on the field region is inclined at an angle to a top surface of the substrate.

17. The device of claim 14, wherein, on the field region, the gate spacer comprises:

a first portion, which has a constant width and is vertically extended; and a second portion, which is connected to the first portion and is located adjacent to a lower portion of the gate electrode.

\* \* \* \* \*